(12) United States Patent
Kim et al.

(10) Patent No.: US 12,453,284 B2
(45) Date of Patent: *Oct. 21, 2025

(54) ANTHRACENE COMPOUND AND ORGANIC LIGHT-EMITTING DEVICE COMPRISING SAME

(71) Applicant: LG CHEM, LTD., Seoul (KR)

(72) Inventors: Hoon Jun Kim, Daejeon (KR); Ji Young Choi, Daejeon (KR); Wanpyo Hong, Daejeon (KR); Woochul Lee, Daejeon (KR); Joo Ho Kim, Daejeon (KR)

(73) Assignee: LG CHEM, LTD., Seoul (KR)

( * ) Notice: Subject to any disclaimer, the term of this patent is extended or adjusted under 35 U.S.C. 154(b) by 980 days.

This patent is subject to a terminal disclaimer.

(21) Appl. No.: 17/607,120

(22) PCT Filed: Oct. 30, 2020

(86) PCT No.: PCT/KR2020/015006
§ 371 (c)(1),
(2) Date: Oct. 28, 2021

(87) PCT Pub. No.: WO2021/086099
PCT Pub. Date: May 6, 2021

(65) Prior Publication Data
US 2022/0165966 A1    May 26, 2022

(30) Foreign Application Priority Data
Oct. 30, 2019    (KR) .................. 10-2019-0136733

(51) Int. Cl.
| | | |
|---|---|---|
| *H10K 85/60* | (2023.01) | |
| *C07D 307/91* | (2006.01) | |
| *H10K 50/11* | (2023.01) | |
| *H10K 101/10* | (2023.01) | |

(52) U.S. Cl.
CPC ....... *H10K 85/6574* (2023.02); *C07D 307/91* (2013.01); *H10K 50/11* (2023.02); *H10K 2101/10* (2023.02)

(58) Field of Classification Search
CPC ... H10K 85/6574; H10K 50/11; C07D 307/91
See application file for complete search history.

(56) References Cited

U.S. PATENT DOCUMENTS

| | | | |
|---|---|---|---|
| 8,759,818 B2 | 6/2014 | LeCloux et al. | |
| 2002/0076576 A1* | 6/2002 | Li | H10K 85/00 428/917 |
| 2008/0315754 A1* | 12/2008 | Kawamura | H10K 85/6576 549/469 |
| 2010/0045170 A1 | 2/2010 | Lee et al. | |
| 2011/0121269 A1* | 5/2011 | Lecloux | C07C 15/28 564/426 |
| 2015/0041773 A1 | 2/2015 | Park et al. | |
| 2015/0144898 A1 | 5/2015 | Dai et al. | |
| 2017/0018723 A1 | 1/2017 | Cha et al. | |
| 2017/0025608 A1 | 1/2017 | Herron et al. | |

(Continued)

FOREIGN PATENT DOCUMENTS

| | | |
|---|---|---|
| EP | 3524661 A1 | 8/2019 |
| JP | 2007077094 A * | 3/2007 |

(Continued)

OTHER PUBLICATIONS

Czerwieniec et al., "Blue-Light Emission of Cu(I) Complexes and Singlet Harvesting", Inorganic Chemistry (2011) vol. 50, pp. 8293-8301. (Year: 2011).*
Hirata et al., "Relationship between room temperature phosphorescence and deuteration position in a purely aromatic compound", Chemical Physics Letters, 591 (2014) pp. 119-125. (Year: 2013).*
Totani et al., machine translation of JP-2007077094-A (2007) pp. 1-38. (Year: 2007).*
Tsuji et al., "The hydrogen/deuterium isotope effect of the host material on the lifetime of organic light-emitting diodes," Chem. Commun. 50:14870-14872 (2014).

*Primary Examiner* — Dylan C Kershner
(74) *Attorney, Agent, or Firm* — Bryan Cave Leighton Paisner LLP

(57) ABSTRACT

Provided is an anthracene compound of Chemical Formula 1:

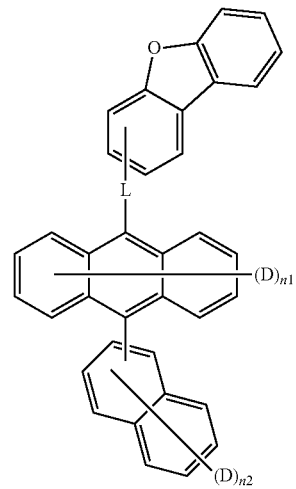

<Chemical Formula 1> wherein, in Chemical Formula 1: D is deuterium; n1 is 8; n2 is 7; and L is a direct bond or a substituted or unsubstituted arylene group, and an organic light emitting device including the same. Including a compound of Chemical Formula 1 in an organic light emitting device can lower the driving voltage and enhance light efficiency. In addition, lifetime properties of the device can be enhanced by thermal stability of the compound. The compound of Chemical Formula 1 has an advantage in terms of production costs since the amount of deuterium source used in the preparation is reduced.

10 Claims, 1 Drawing Sheet

(56) References Cited

U.S. PATENT DOCUMENTS

| | | |
|---|---|---|
| 2018/0013071 A1 | 1/2018 | Cha et al. |
| 2018/0182971 A1 | 6/2018 | Park et al. |
| 2019/0305227 A1 | 10/2019 | Yoon et al. |
| 2020/0013957 A1 | 1/2020 | Suh et al. |
| 2022/0384733 A1* | 12/2022 | Choi .................. H10K 85/6574 |
| 2023/0084250 A1* | 3/2023 | Lee ...................... H10K 85/626 257/40 |

FOREIGN PATENT DOCUMENTS

| | | |
|---|---|---|
| KR | 10-0910150 | 8/2009 |
| KR | 10-2013-0022071 | 3/2013 |
| KR | 10-2015-0011347 | 1/2015 |
| KR | 10-2015-0018229 | 2/2015 |
| KR | 10-2016-0095827 | 8/2016 |
| KR | 10-2016-0112111 | 9/2016 |
| KR | 10-2017-0008673 | 1/2017 |
| KR | 10-2017-0009714 | 1/2017 |
| KR | 10-2017-0010724 | 2/2017 |
| KR | 10-2017-0039020 | 4/2017 |
| KR | 10-2018-0037717 | 4/2018 |
| KR | 10-2018-0068861 | 6/2018 |
| KR | 10-2019-0113498 | 10/2019 |
| WO | 2018-164511 | 9/2018 |

\* cited by examiner

[FIG. 1]
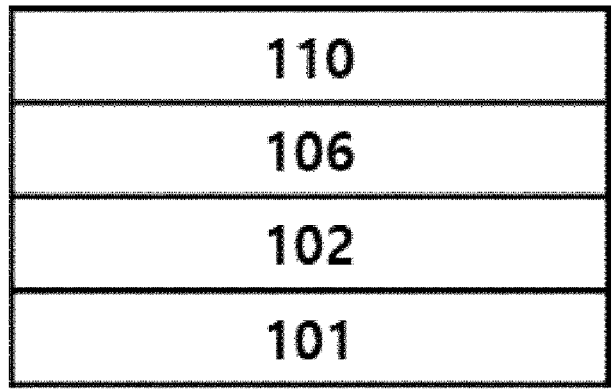
[FIG. 2]
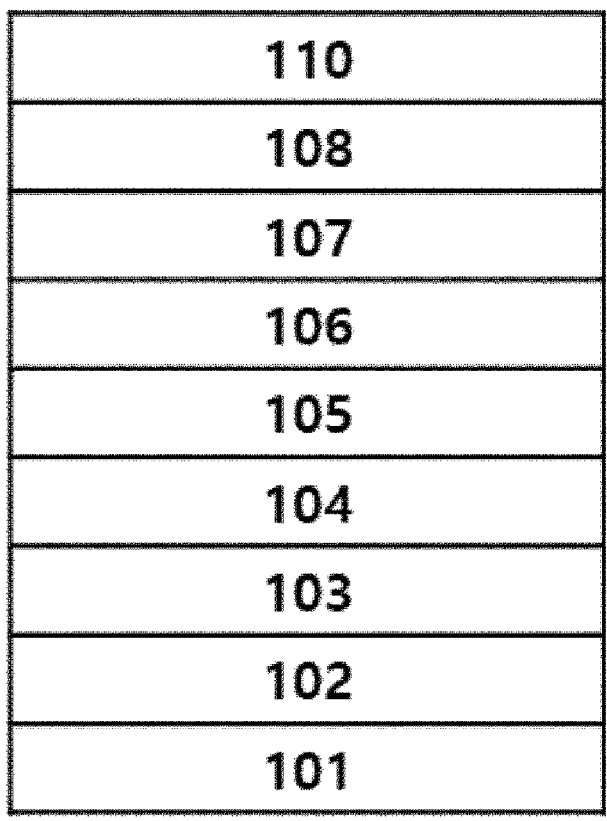

ANTHRACENE COMPOUND AND ORGANIC LIGHT-EMITTING DEVICE COMPRISING SAME

CROSS-REFERENCE TO RELATED APPLICATION(S)

This application is a National Stage Application of International Application No. PCT/KR2020/015006 filed on Oct. 30, 2020, which claims priority to and the benefits of Korean Patent Application No. 10-2019-0136733, filed with the Korean Intellectual Property Office on Oct. 30, 2019, the entire contents of which are incorporated herein by reference.

TECHNICAL FIELD

The present specification relates to an anthracene compound, and an organic light emitting device comprising the same.

BACKGROUND

An organic light emission phenomenon generally refers to a phenomenon converting electrical energy to light energy using an organic material. An organic light emitting device using an organic light emission phenomenon normally has a structure including an anode, a cathode, and an organic material layer therebetween. Herein, the organic material layer is often formed in a multilayer structure formed with different materials in order to increase efficiency and stability of the organic light emitting device, and for example, can be formed with a hole injection layer, a hole transfer layer, a light emitting layer, an electron transfer layer, an electron injection layer and the like. When a voltage is applied between the two electrodes in such an organic light emitting device structure, holes and electrons are injected to the organic material layer from the anode and the cathode, respectively, and when the injected holes and electrons meet, excitons are formed, and light emits when these excitons fall back to the ground state.

Development of new materials for such an organic light emitting device has been continuously required.

[Prior Art Documents—Patent Documents] (Patent Document 1) Korean Patent Application Laid-Open Publication No. 10-2015-0011347

BRIEF DESCRIPTION

Technical Problem

The present specification is directed to providing an anthracene compound, and an organic light emitting device including the same.

Technical Solution

One embodiment of the present specification provides an anthracene compound of Chemical Formula 1:

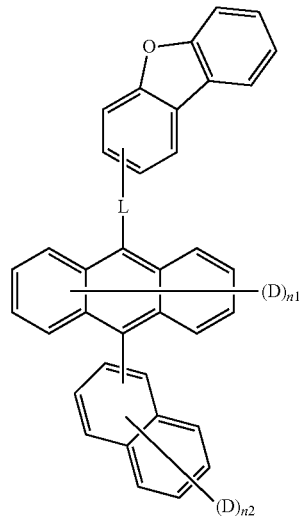

<Chemical Formula 1> wherein in Chemical Formula 1:
D is deuterium;
n1 is 8;
n2 is 7; and
L is a direct bond or a substituted or unsubstituted arylene group.

Another embodiment of the present specification provides an organic light emitting device including a first electrode; a second electrode provided opposite to the first electrode; and one or more organic material layers provided between the first electrode and the second electrode, wherein one or more layers of the organic material layers include the anthracene compound described above.

Advantageous Effects

A compound according to one embodiment of the present specification is used in an organic light emitting device to lower a driving voltage of the organic light emitting device and to enhance light efficiency. In addition, lifetime properties of the device can be enhanced by thermal stability of the compound.

In addition, the compound according to one embodiment of the present specification can be used in a solution process, and a large-area device can be manufactured.

DESCRIPTION OF THE DRAWINGS

FIG. 1 and FIG. 2 each illustrate an example of an organic light emitting device according to one embodiment of the present specification.

REFERENCE NUMERALS

101: Substrate
102: Anode
103: Hole Injection Layer
104: Hole Transfer Layer
105: Electron Blocking Layer
106: Light Emitting Layer
107: Electron Transfer Layer
108: Electron Injection Layer
110: Cathode

DETAILED DESCRIPTION

Hereinafter, the present specification will be described in more detail.

An anthracene compound of Chemical Formula 1 includes dibenzofuran and a naphthyl group as a substituent. The dibenzofuran is not substituted with deuterium, and the anthracene and the naphthyl group are substituted with deuterium. The structure of Chemical Formula 1 has excellent hole and electron migration and injection abilities, and has a property of low voltage when used in a device. In addition, the anthracene compound of Chemical Formula 1 has a relatively high triplet energy value, and has properties of long lifetime and high efficiency when used as a host of a light emitting layer of an organic light emitting device.

In addition, Chemical Formula 1 includes deuterium at all positions of the anthracene and the naphthyl group, which improves device efficiency and lifetime. When replacing hydrogen with deuterium, a vibration damping effect is obtained in the molecule due to an increase in the weight of the deuterium, a vibrator. This leads to a change in vibrational energy contributing to molecular energy, and lowers the molecular energy to stabilize. An effect of increasing activation energy required to cleave the bond of the stabilized molecule is obtained. As a result, Chemical Formula 1 can improve device efficiency and lifetime by including deuterium.

Since both HOMO and LUMO of the compound of Chemical Formula 1 are located on the anthracene, specific positions of the anthracene (for example, carbon at positions other than positions 9 and 10 of anthracene) have high reactivity. Replacing hydrogen at such specific positions with deuterium can decrease reactivity and increase material rigidity, and furthermore, can enhance a device lifetime.

In addition, when substituting the compound of Chemical Formula 1 with deuterium, solubility is superior, and the yield is high and the amount of the deuterium source used can be reduced.

In the present specification,

means a linking site.

Examples of substituents in the present specification are described below, however, the substituents are not limited thereto.

The term "substitution" means a hydrogen atom bonding to a carbon atom of a compound being changed to another substituent, and the position of substitution is not limited as long as it is a position at which the hydrogen atom is substituted, that is, a position at which a substituent can substitute, and when two or more substituents substitute, the two or more substituents can be the same as or different from each other.

In the present specification, the term "substituted or unsubstituted" means being substituted with one, two or more substituents selected from the group consisting of deuterium, a halogen group, a nitrile group, an alkyl group, an aryl group, and a heteroaryl group including one or more of heteroatoms that are not carbon, or being substituted with a substituent linking two or more substituents among the substituents illustrated above, or having no substituents.

In the present specification, linking two or more substituents refers to replacing hydrogen of any one substituent with another substituent. For example, an isopropyl group and a phenyl group can be linked to become a substituent of

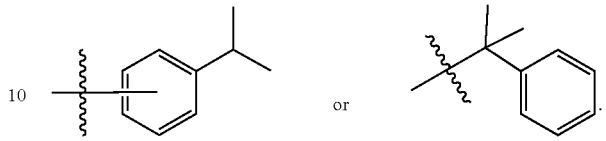

In the present specification, linking three substituents includes not only continuously linking (substituent 1)-(substituent 2)-(substituent 3), but also linking (substituent 2) and (substituent 3) to (substituent 1). For example, two phenyl groups and an isopropyl group can be linked to become a substituent of

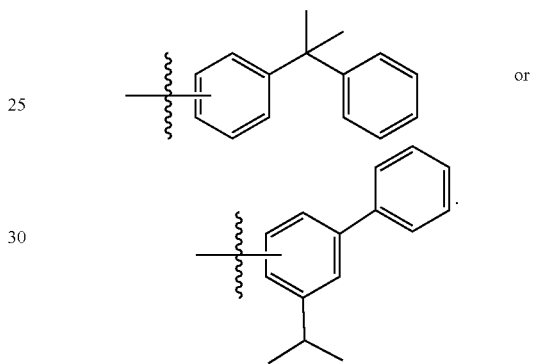

The same rule described above applies to linking four or more substituents.

In the present specification, N % substituted with deuterium means N % of hydrogen available in the corresponding structure being substituted with deuterium. For example, 25% substituted with deuterium in dibenzofuran means two of eight hydrogens of dibenzofuran being substituted with deuterium.

In the present specification, the degree of deuteration can be identified using known methods such as nuclear magnetic resonance spectroscopy ($^1$H NMR) or GC/MS.

In the present specification, examples of the halogen group can include fluorine, chlorine, bromine or iodine.

In the present specification, the alkyl group can be linear or branched, and although not particularly limited thereto, the number of carbon atoms is preferably from 1 to 30; 1 to 20; 1 to 10; or 1 to 5. Specific examples thereof can include methyl, ethyl, propyl, n-propyl, isopropyl, butyl, n-butyl, isobutyl, t-butyl, sec-butyl, 1-methylbutyl, 1-ethylbutyl, pentyl, n-pentyl, isopentyl, neopentyl, t-pentyl, hexyl, n-hexyl, 1-methylpentyl, 2-methylpentyl, 3,3-dimethylbutyl, 2-ethylbutyl, heptyl, n-heptyl, 1-methylhexyl, cyclopentylmethyl, cyclohexylmethyl, octyl, n-octyl, t-octyl, 1-methylheptyl, 2-ethylhexyl, 2-propylpentyl, n-nonyl, 2,2-dimethylheptyl, 1-ethylpropyl, 1,1-dimethylpropyl, isohexyl, 4-methylhexyl, 5-methylhexyl and the like, but are not limited thereto.

In the present specification, the aryl group means monovalent aromatic hydrocarbon or a monovalent group of an aromatic hydrocarbon derivative. In the present specification, the aromatic hydrocarbon means a compound including a ring having pi electrons completely conjugated and planar, and the group derived from aromatic hydrocarbon means a structure in which aromatic hydrocarbon or cyclic aliphatic hydrocarbon is fused to aromatic hydrocarbon. In addition, the aryl group in the present specification includes a monovalent group in which two or more aromatic hydrocarbons or aromatic hydrocarbon derivatives are linked to each other. The aryl group is not particularly limited, but preferably has 6 to 50; 6 to 30; 6 to 25; 6 to 20; 6 to 18; or 6 to 13 carbon atoms, and the aryl group can be monocyclic or polycyclic. Specific examples of the monocyclic aryl group can include a phenyl group, a biphenyl group, a terphenyl group and the like, but are not limited thereto. Specific examples of the polycyclic aryl group can include a naphthyl group, an anthracenyl group, a phenanthryl group, a triphenyl group, a pyrenyl group, a perylenyl group, a chrysenyl group, a fluorenyl group and the like, but are not limited thereto.

In the present specification, the fluorenyl group can be substituted, and adjacent substituents can bond to each other to form a ring.

When the present specification describes that the fluorenyl group can be substituted, the substituted fluorenyl group includes all compounds in which substituents of the fluorene pentagonal ring spiro-bond to each other to form an aromatic hydrocarbon ring. The substituted fluorenyl group can include 9,9'-spirobifluorene, spiro[cyclopentane-1,9'-fluorene], spiro[benzo[c]fluorene-7,9-fluorene] and the like, but is not limited thereto.

In the present specification, the heteroaryl group means a monovalent aromatic heteroring. Herein, the aromatic heteroring means, as a monovalent group of an aromatic ring or an aromatic ring derivative, a group including one or more of N, O and S in the ring as a heteroatom. The aromatic ring derivative includes all structures in which an aromatic ring or aliphatic ring is fused to an aromatic ring. In addition, the heteroaryl group in the present specification includes a monovalent group in which two or more aromatic rings including a heteroatom or aromatic ring derivatives including a heteroatom are linked to each other. The heteroaryl group preferably has 2 to 50; 2 to 30; 2 to 20; 2 to 18; or 2 to 13 carbon atoms. Examples of the heteroaryl group can include a thiophene group, a furanyl group, a pyrrole group, an imidazole group, a thiazole group, an oxazole group, a pyridine group, a pyrimidine group, a triazine group, a triazole group, an acridine group, a pyridazine group, a pyrazine group, a quinoline group, a quinazoline group, a quinoxaline group, an isoquinoline group, an indole group, a carbazole group, a benzoxazole group, a benzimidazole group, a benzothiazole group, a benzocarbazole group, a benzothiophene group, a dibenzothiophene group, a benzofuran group, a phenanthrolinyl group, a dibenzofuran group and the like, but are not limited thereto.

In the present specification, the heteroaryl group can be monocyclic or polycyclic, and can be aromatic, aliphatic, or a fused ring of aromatic and aliphatic.

In the present specification, the arylene group means the aryl group having two bonding sites, that is, a divalent group. The descriptions on the aryl group provided above can be applied thereto except for those that are each a divalent group.

Hereinafter, an anthracene compound represented by the following Chemical Formula 1 will be described in detail:

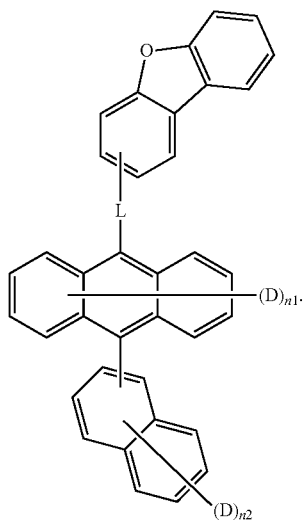

<Chemical Formula 1>

In Chemical Formula 1,

D is deuterium, n1 is 8, n2 is 7, and

L is a direct bond or a substituted or unsubstituted arylene group.

In one embodiment of the present specification, n1 is 8.

When the anthracene is substituted with 8 deuterium, rigidity of the compound can increase by replacing highly reactive positions with the deuterium. Furthermore, a device lifetime can be enhanced.

In one embodiment of the present specification, n2 is 7.

In one embodiment of the present specification, L is a direct bond or a substituted or unsubstituted arylene group.

In one embodiment of the present specification, L is a direct bond or a substituted or unsubstituted arylene group having 6 to 30 carbon atoms.

In one embodiment of the present specification, L is a direct bond or an arylene group having 6 to 20 carbon atoms that are unsubstituted or substituted with deuterium.

In one embodiment of the present specification, L is a direct bond or an arylene group having 6 to 10 carbon atoms that are unsubstituted or substituted with deuterium.

In one embodiment of the present specification, L is a direct bond; a phenylene group that is unsubstituted or substituted with deuterium; a biphenylene group that is unsubstituted or substituted with deuterium; or a naphthylene group that is unsubstituted or substituted with deuterium.

In one embodiment of the present specification, L is a direct bond; a phenylene group that unsubstituted or substituted with deuterium; or a naphthylene group that is unsubstituted or substituted with deuterium.

In one embodiment of the present specification, L is a direct bond, a phenylene group, or a naphthylene group.

In one embodiment of the present specification, L is a direct bond or any one selected from among the following structures:

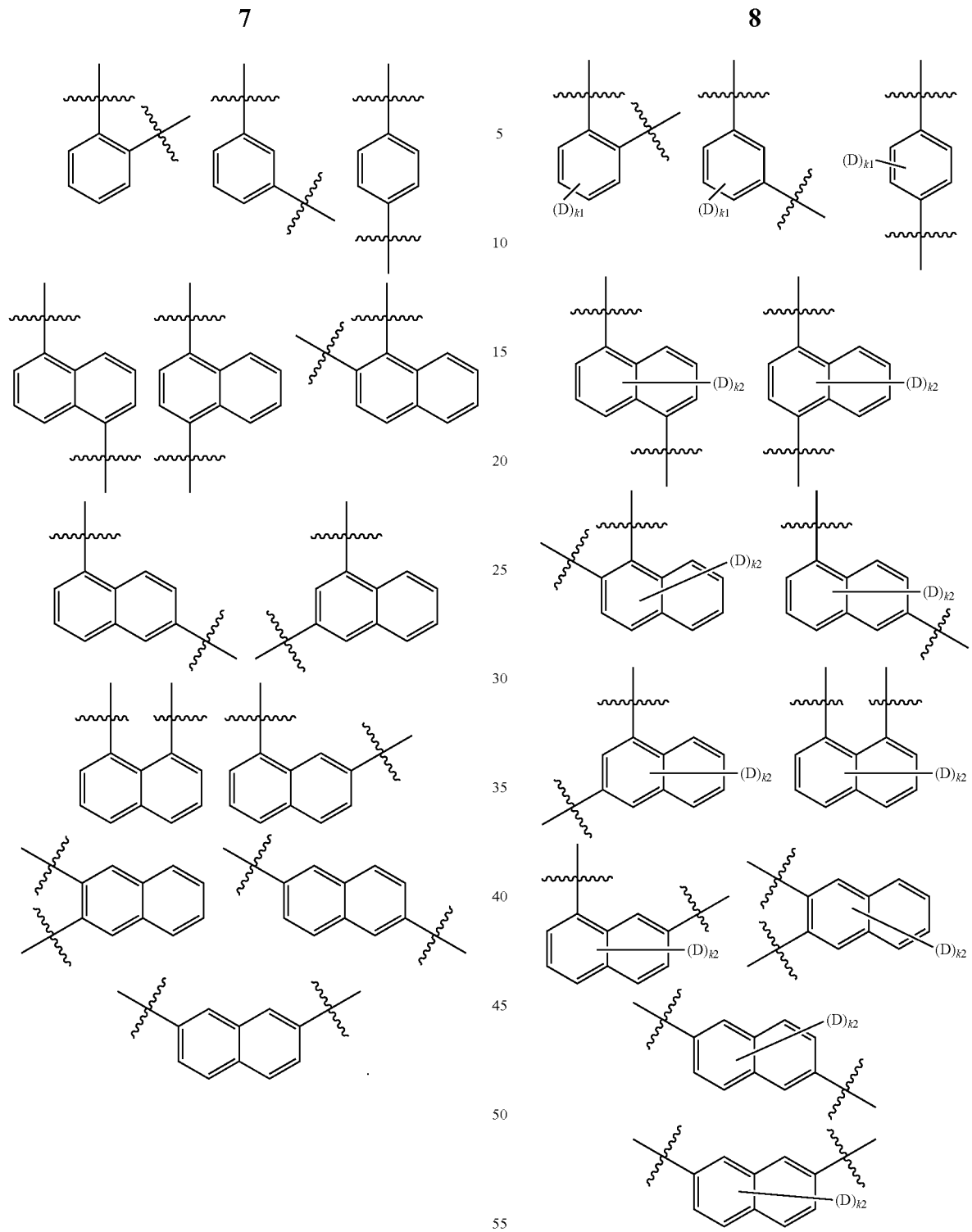

The structures can be substituted with a substituent selected from the group consisting of deuterium, an alkyl group, an aryl group, and a heteroaryl group, or a substituent linking two or more of the substituents, or can have no substituents.

In one embodiment of the present specification, L includes deuterium as a substituent.

In one embodiment of the present specification, L is a direct bond or any one selected from among the following structures:

wherein in the structures, D means deuterium, k1 is an integer of 0 to 4, and k2 is an integer of 0 to 6.

In one embodiment of the present specification, k1 is an integer of 1 to 4.

In one embodiment of the present specification, k2 is an integer of 1 to 6.

In one embodiment of the present specification, k1 is 4.

In one embodiment of the present specification, k2 is 6.

In one embodiment of the present specification, k1 is 0.

In one embodiment of the present specification, k2 is 0.

In one embodiment of the present specification, Chemical Formula 1 is any one of the following Chemical Formulae 101 to 104:

<Chemical Formula 101>

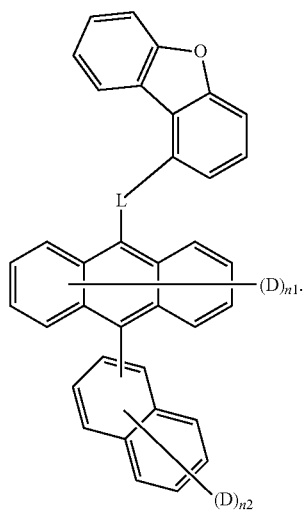

<Chemical Formula 102>

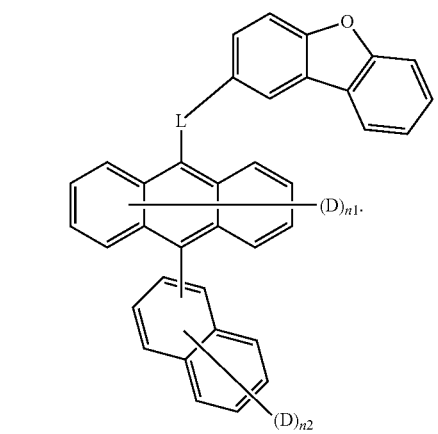

<Chemical Formula 103>

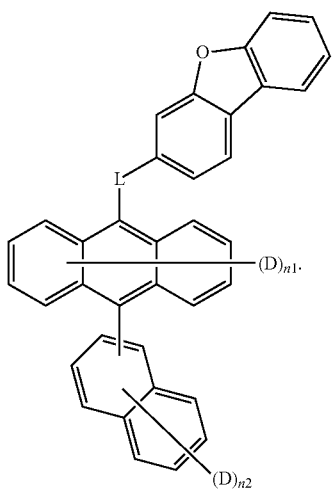

<Chemical Formula 104>

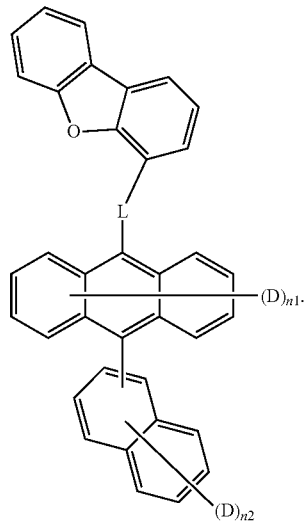

wherein in Chemical Formulae 101 to 104, D, n1, n2 and L have the same definitions as in Chemical Formula 1.

When linked to anthracene through the number 1 or 2 carbon of dibenzofuran as in Chemical Formulae 101 and 102, a device has decreased driving voltage, increased efficiency, or increased lifetime compared when linked through the number 3 or 4 carbon of dibenzofuran (Chemical Formula 103 or 104).

In one embodiment of the present specification, Chemical Formula 1 is the following Chemical Formula 201 or 202:

<Chemical Formula 201>

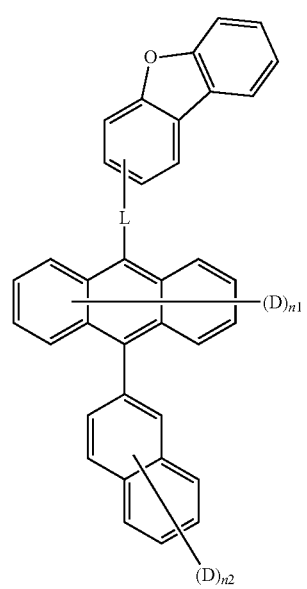

<Chemical Formula 202>
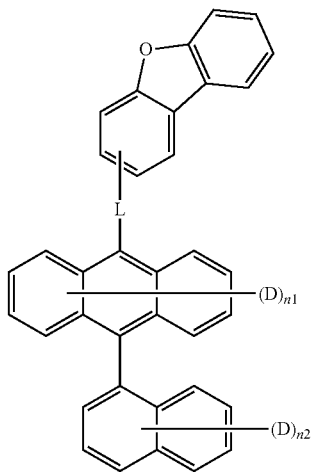
wherein in Chemical Formula 201 or 202, D, n1, n2 and L have the same definitions as in Chemical Formula 1.
In one embodiment of the present specification, Chemical Formula 1 is any one of the following Chemical Formulae 301 to 308:
<Chemical Formula 301>
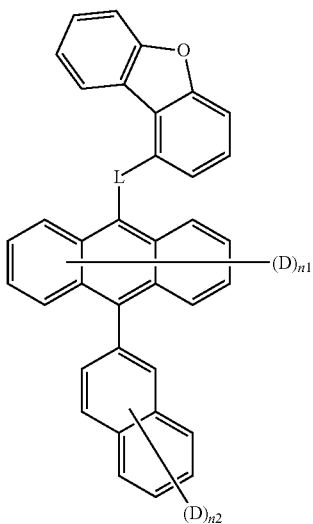
<Chemical Formula 302>
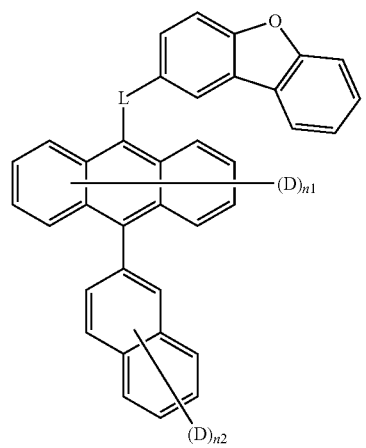
<Chemical Formula 303>
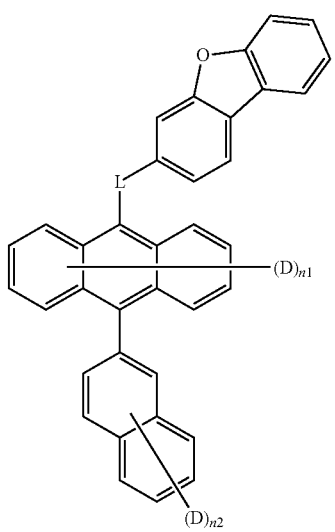
<Chemical Formula 304>
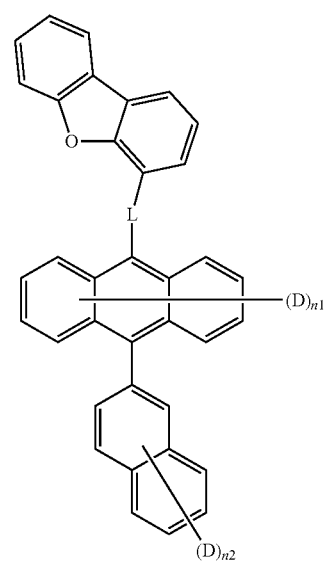
<Chemical Formula 305>
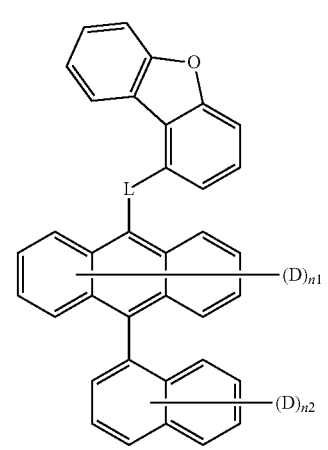

<Chemical Formula 306>
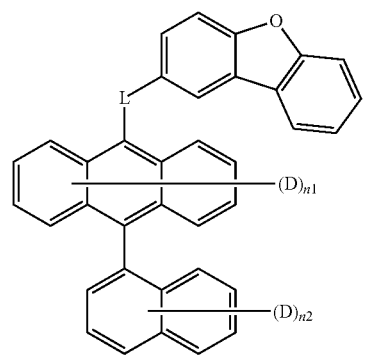
<Chemical Formula 307>
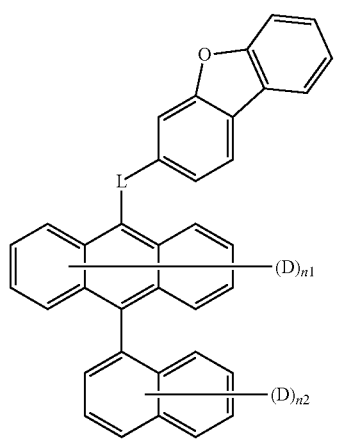
<Chemical Formula 308>
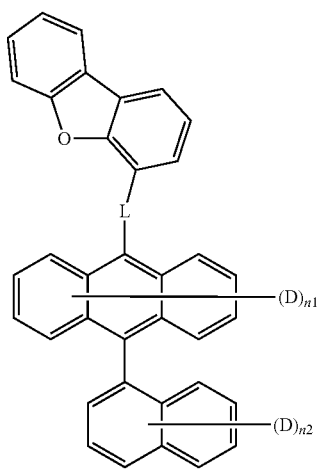
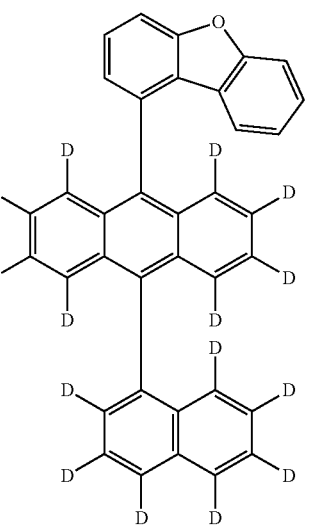
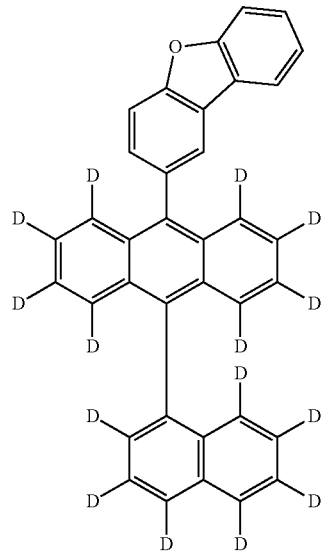
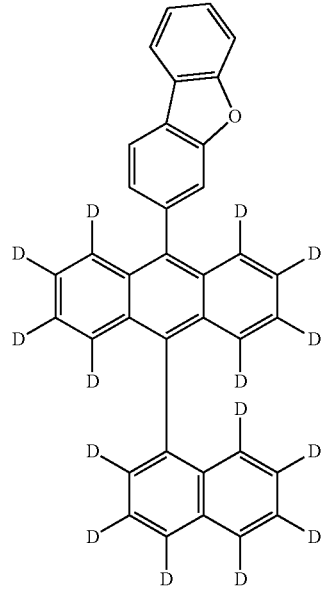
wherein in Chemical Formulae 301 to 308, D, n1, n2 and L have the same definitions as in Chemical Formula 1.
In one embodiment of the present specification, the anthracene compound of Chemical Formula 1 is any one compound selected from among the following compounds:

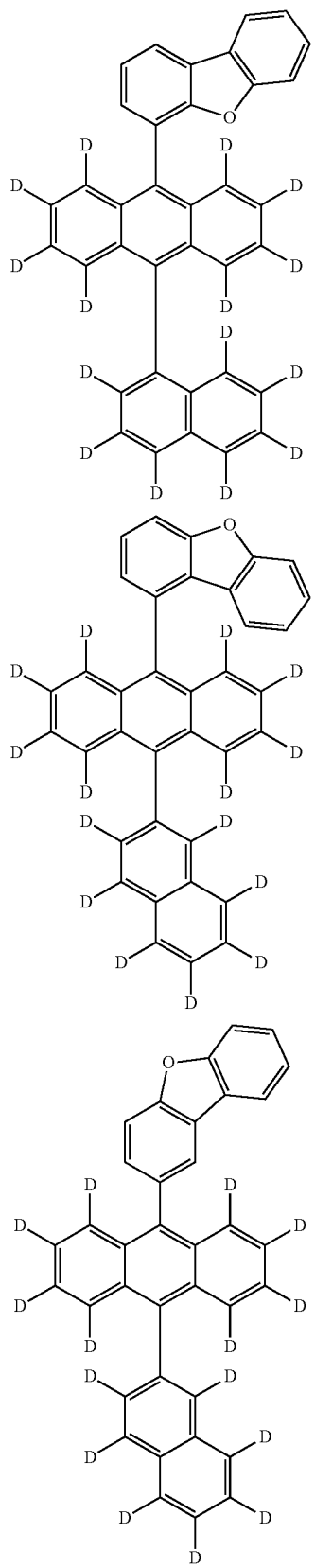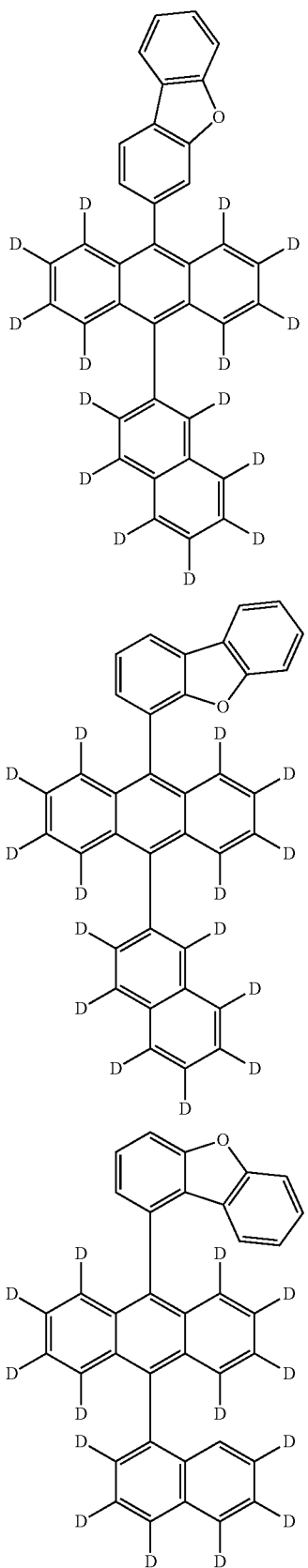

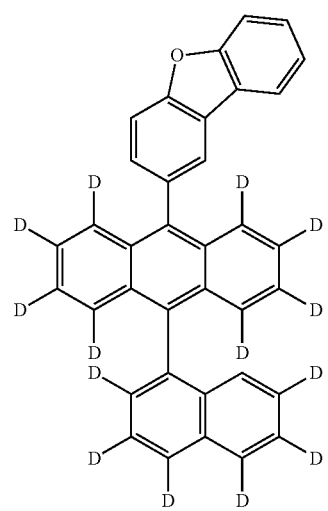
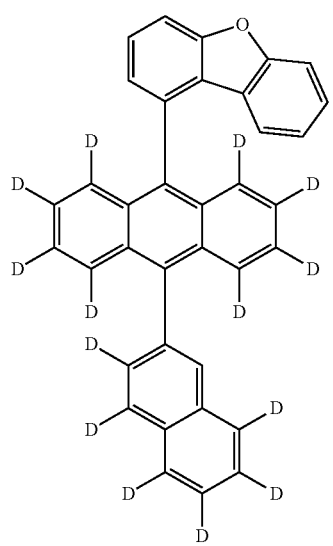
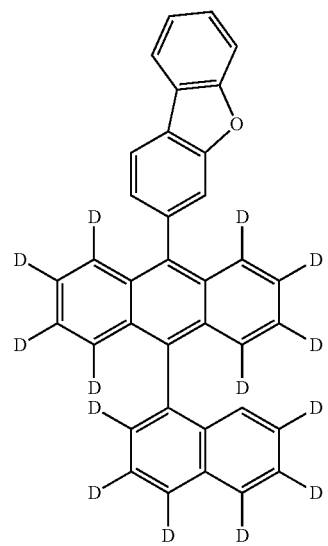
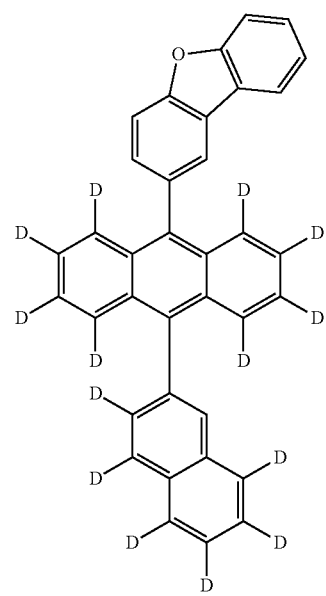

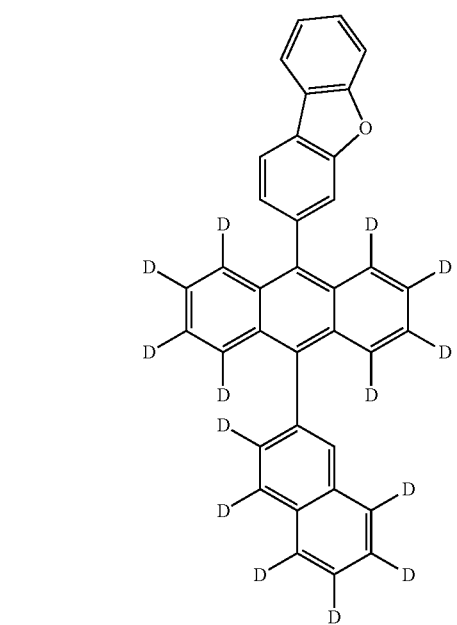
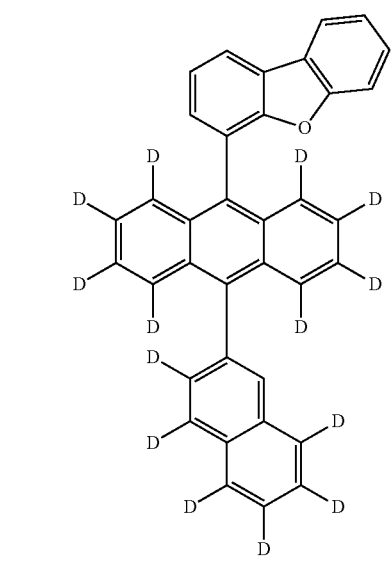
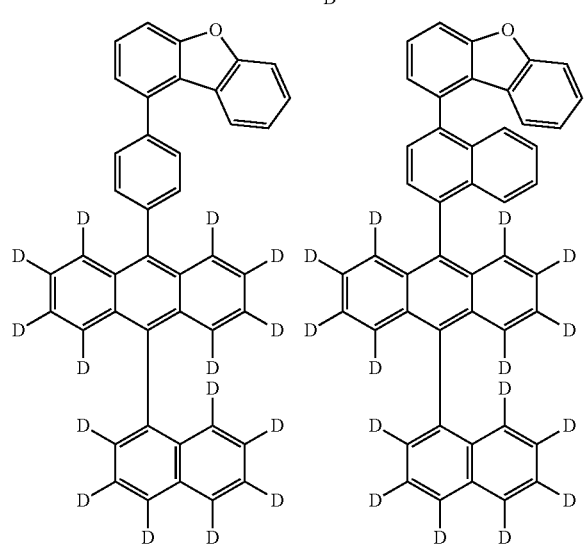
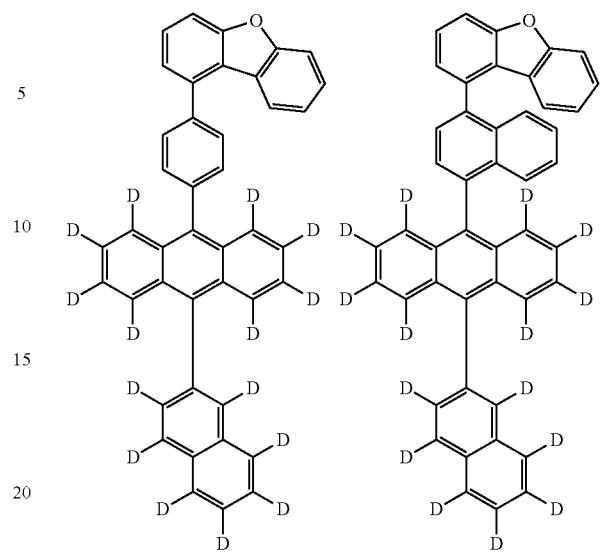
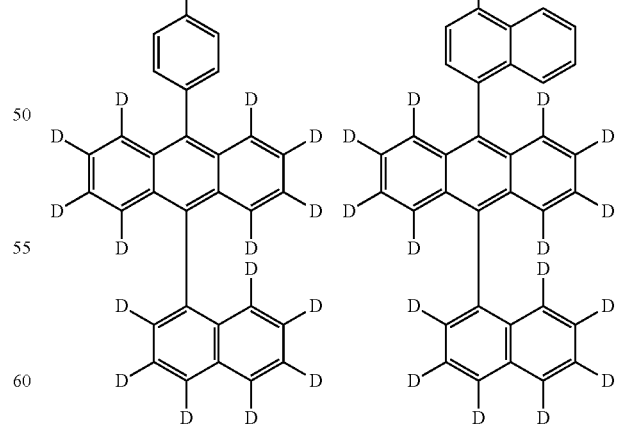

-continued
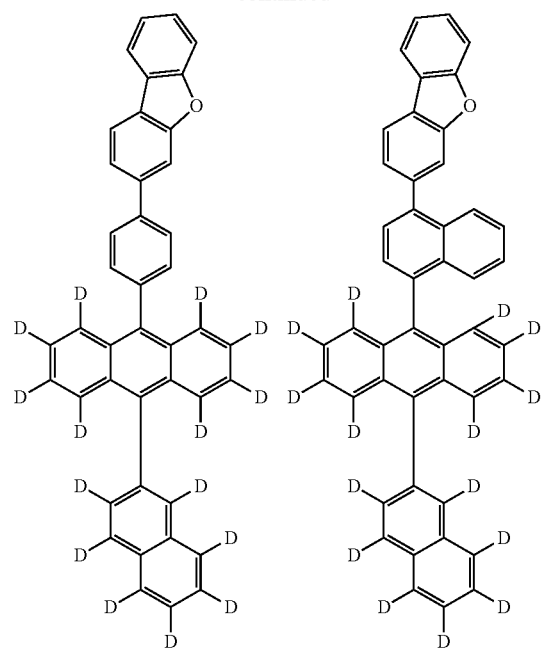
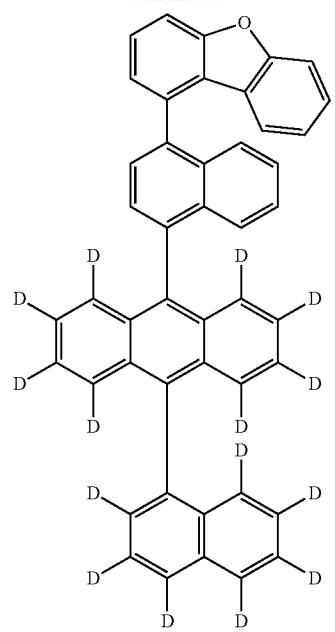
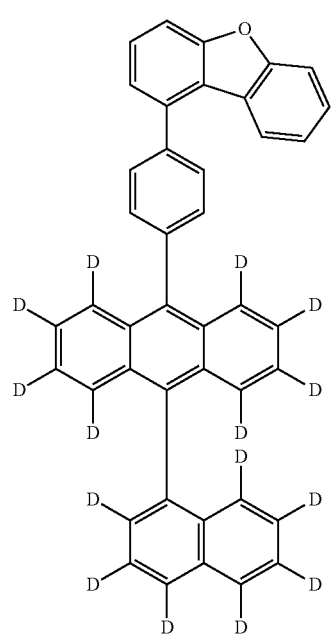
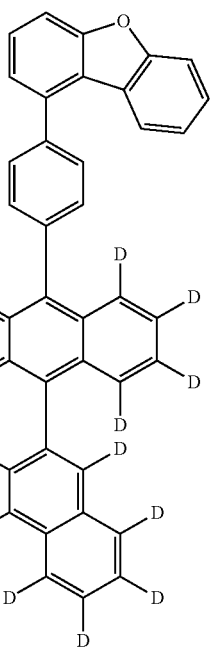

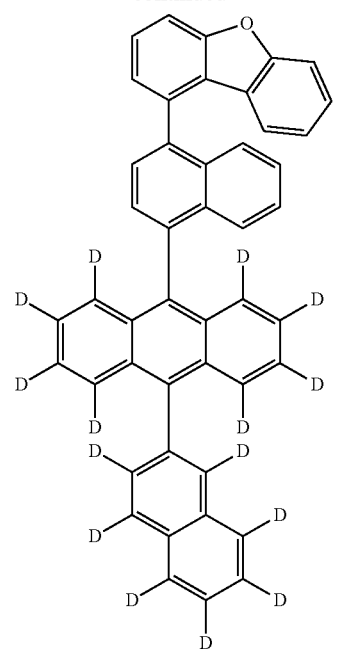
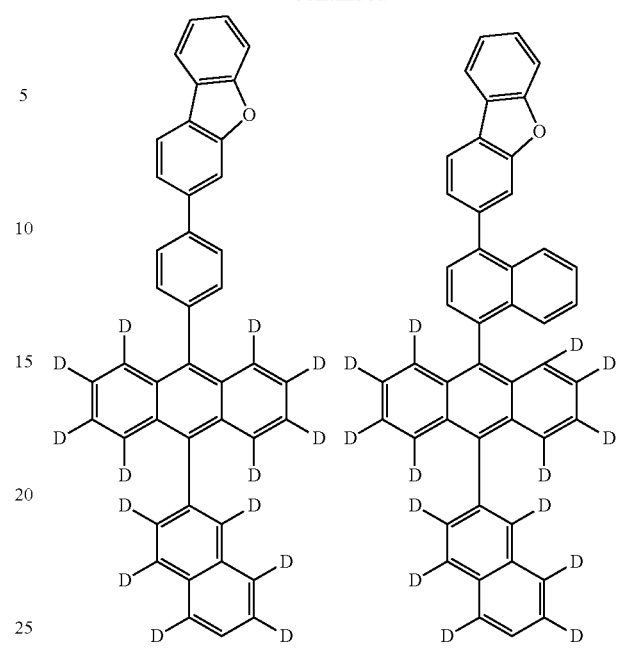
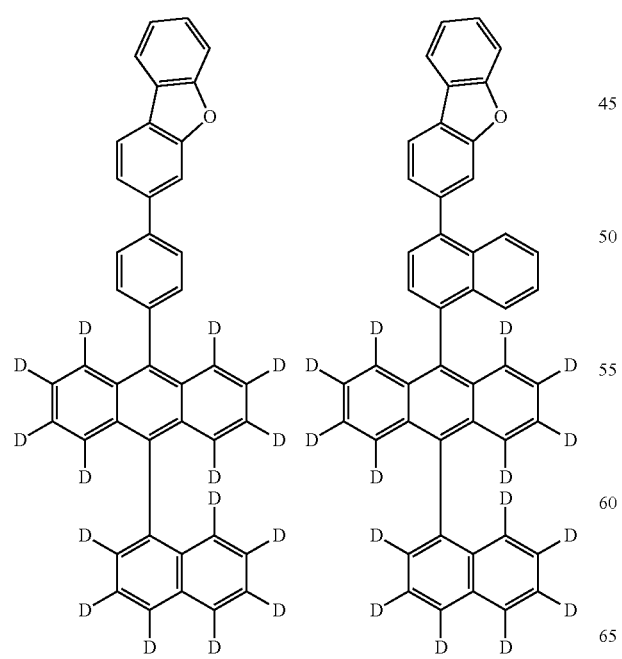
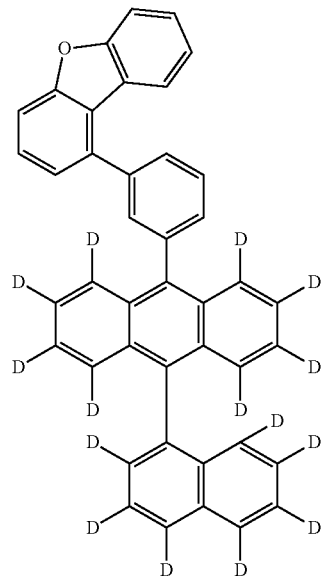

-continued
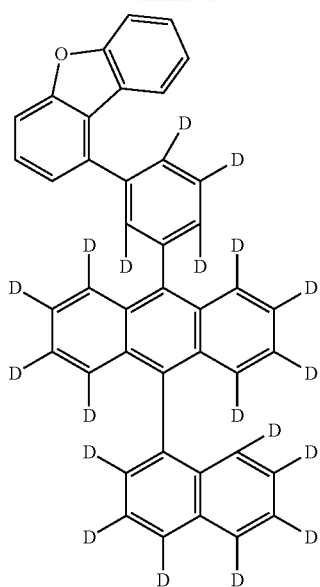
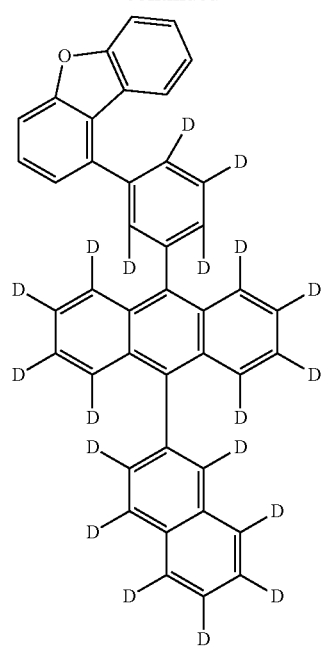
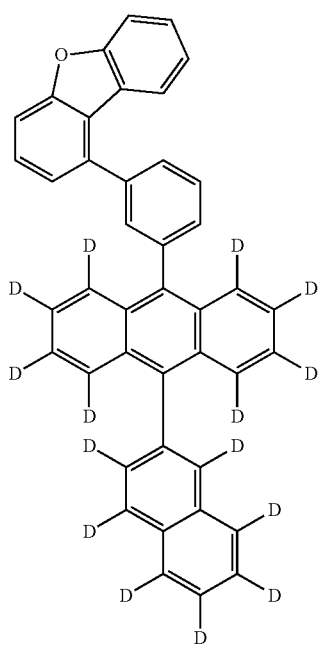
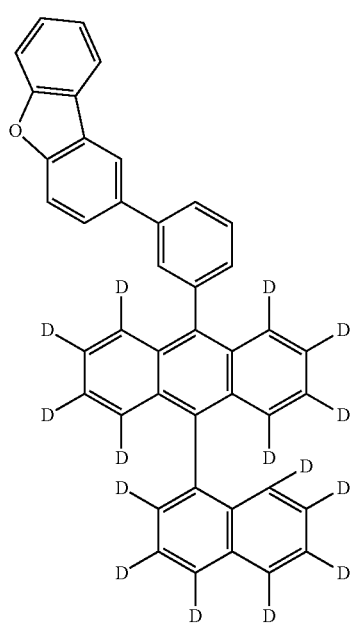

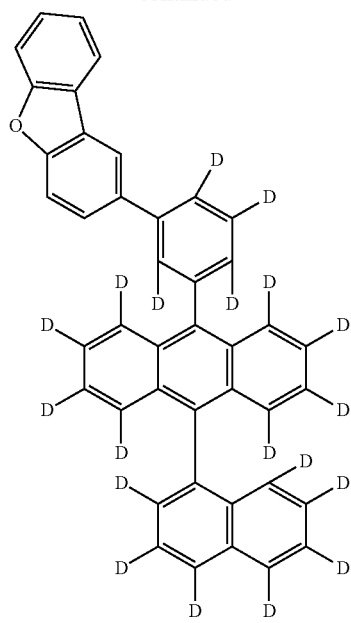
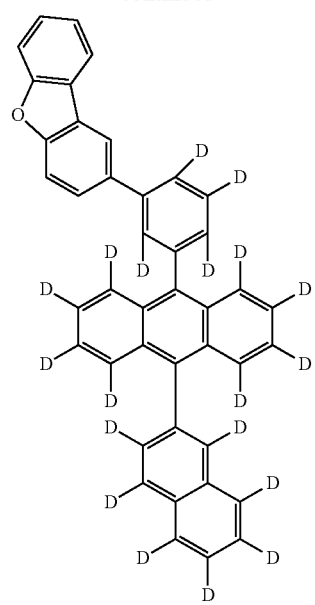

29
-continued
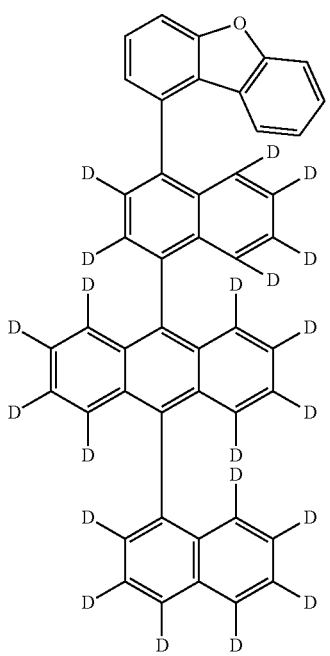
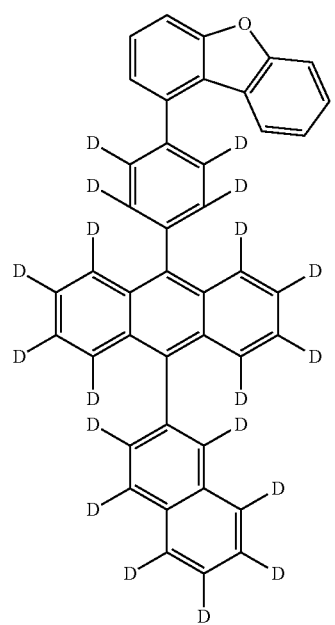
30
-continued
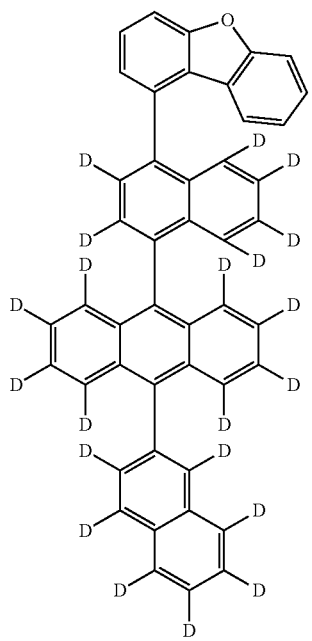
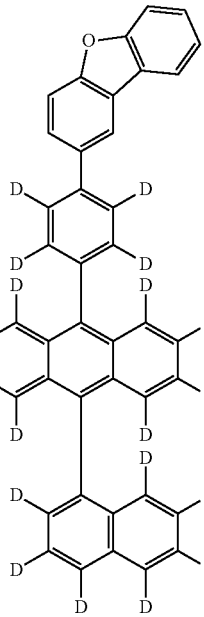 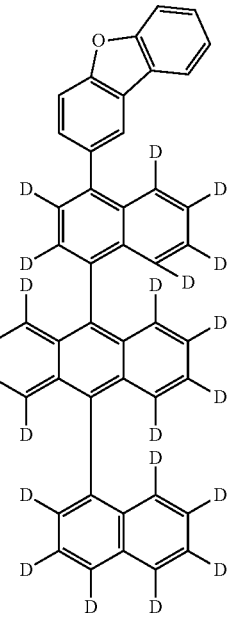

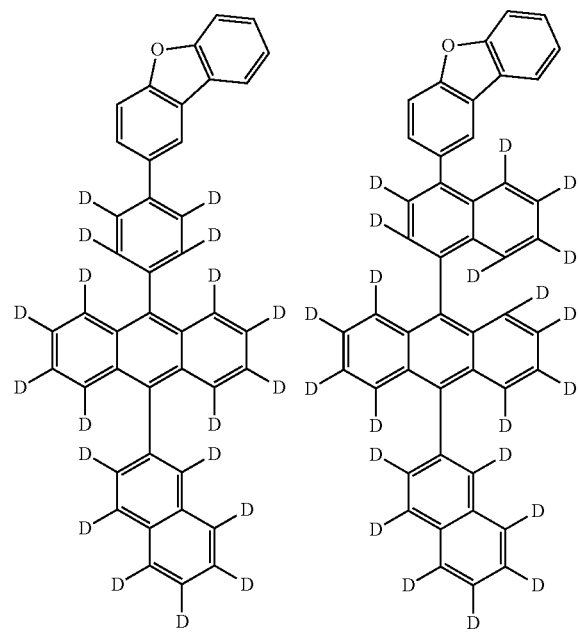
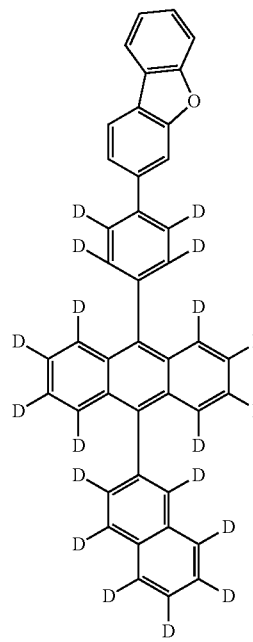
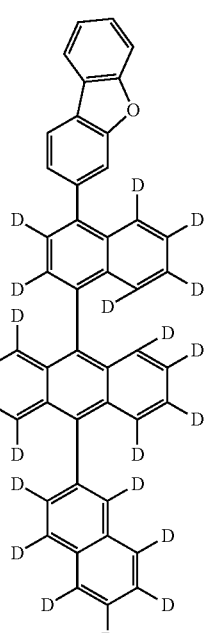
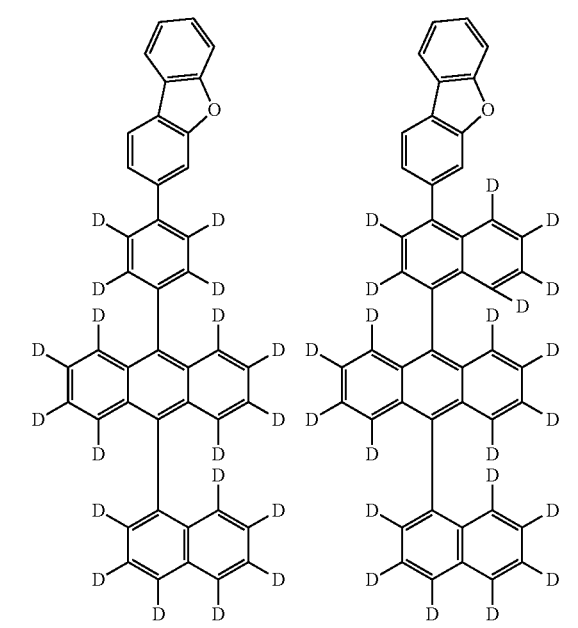
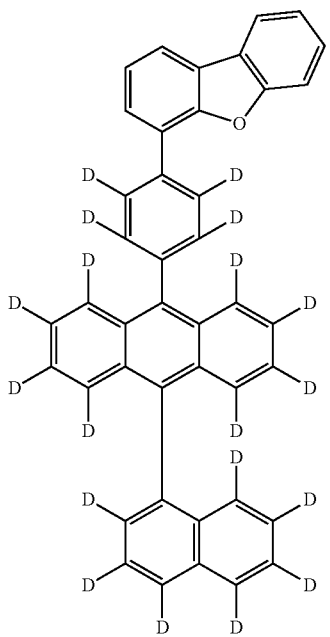

33
-continued
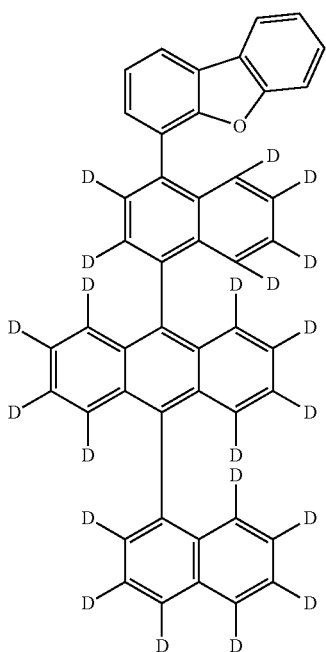
34
-continued
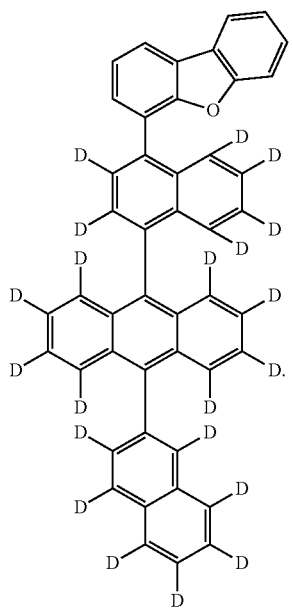
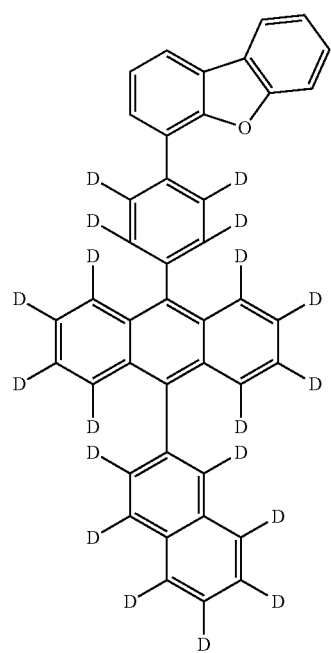
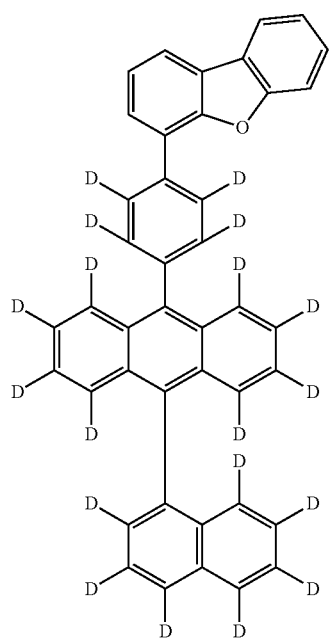

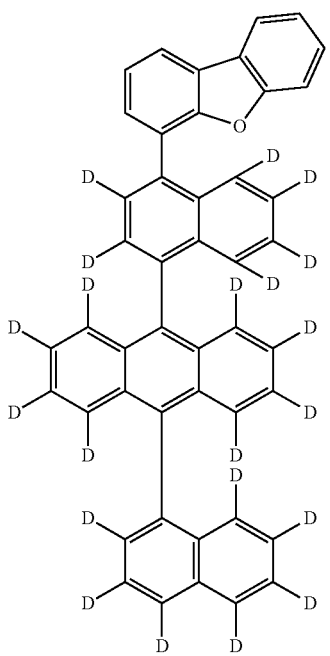

The compound according to one embodiment of the present specification can be prepared using a preparation method as described below. As necessary, substituents can be added or removed, and positions of substituents can vary. In addition, starting materials, reaction materials, reaction conditions and the like can vary based on technologies known in the art.

For example, the compound of Chemical Formula 1 can have the core structure prepared as in the following General Formula 1. Substituents can bond using methods known in the art, and types, positions and the number of the substituents can vary depending on technologies known in the art. Substituents can bond as in the following General Formula 1, however, the bonding is not limited thereto:

<General Formula 1>

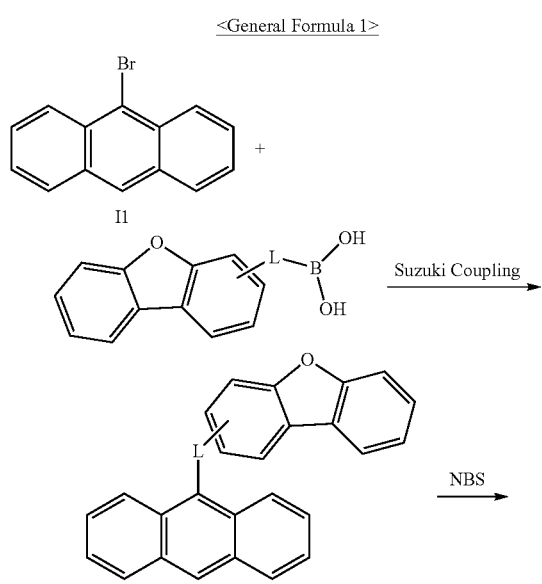

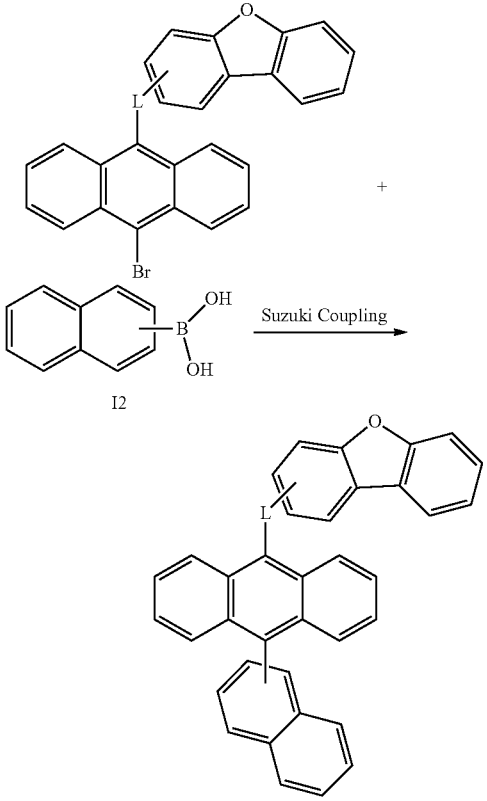

In General Formula 1, L has the same definition as in Chemical Formula 1. Although deuterium is not indicated in General Formula 1, deuterium-substituted reaction materials can be used as I1 and I2, or deuterium can also be introduced to the compound prepared in General Formula 1 through a hydrogen-deuterium exchange reaction using a deuterated solvent under an acid catalyst.

The compound of Chemical Formula 1 including deuterium can be prepared using a known deuteration reaction. According to one embodiment of the present specification, the compound of Chemical Formula 1 can be formed using a deuterated compound as a precursor, or deuterium can also be introduced to the compound through a hydrogen-deuterium exchange reaction using a deuterated solvent under an acid catalyst.

The preparation method can be more specified in preparation examples described later, and the order of reaction can vary depending on the compound, and the method for synthesizing the anthracene compound of Chemical Formula 1 is not limited to the above-mentioned methods.

One embodiment of the present specification provides an organic light emitting device including the compound described above.

One embodiment of the present specification provides an organic light emitting device including a first electrode; a second electrode provided opposite to the first electrode; and one or more organic material layers provided between the first electrode and the second electrode, wherein one or more layers of the organic material layers include the anthracene compound of Chemical Formula 1.

In the present specification, a description of a certain member being placed "on" another member includes not only a case of the one member in contact with the another member but a case of still another member being present between the two members.

In the present specification, a description of a certain part "including" certain constituents means capable of further including other constituents, and does not exclude other constituents unless particularly stated on the contrary.

In the present specification, the "layer" has a meaning compatible with a 'film' often used in the art, and means a coating covering a target area. The size of the "layer" is not limited, and each "layer" can have the same or a different size. In one embodiment, the size of the "layer" can be the same as the whole device, can correspond to the size of a specific functional area, or can be as small as a single sub-pixel.

In the present specification, a meaning of a specific A material being included in a B layer includes both i) one or more types of A materials being included in one B layer, and ii) a B layer being formed in one or more layers, and an A material being included in one or more of the B layers that is a multilayer.

In the present specification, a meaning of a specific A material being included in a C layer or a D layer includes both i) being included in one or more layers of one or more C layers, ii) being included in one or more layers of one or more D layers, or iii) being included in each of one or more C layers and one or more D layers.

The organic light emitting device according to the present specification can include additional organic material layers in addition to the light emitting layer.

The organic material layer of the organic light emitting device of the present specification can be formed in a single layer structure, but can also be formed in a multilayer structure in which two or more organic material layers are laminated. For example, the organic light emitting device of the present specification can have a structure including a hole injection layer, a hole transfer layer, a light emitting layer, an electron transfer layer, an electron injection layer, an electron blocking layer, a hole blocking layer and the like. However, the structure of the organic light emitting device is not limited thereto.

In one embodiment of the present specification, the organic material layer includes a light emitting layer, and the light emitting layer includes the anthracene compound of Chemical Formula 1.

In one embodiment of the present specification, the organic material layer includes a light emitting layer, and the light emitting layer includes the anthracene compound of Chemical Formula 1 as a host.

In one embodiment of the present specification, the light emitting layer includes a host and a dopant. In one embodiment, the host includes the anthracene compound of Chemical Formula 1.

In one embodiment of the present specification, the dopant is a phosphorescent dopant or a fluorescent dopant.

In one embodiment of the present specification, the light emitting layer further includes an arylamine-based compound. In other words, the dopant of the light emitting layer is an arylamine-based compound.

In one embodiment of the present specification, the light emitting layer further includes an arylamine-based compound comprising deuterium.

In another embodiment, the light emitting layer further includes a boron compound. In other words, the dopant of the light emitting layer is a boron compound.

In one embodiment of the present specification, the dopant is the following Chemical Formula Z1 or Z2:

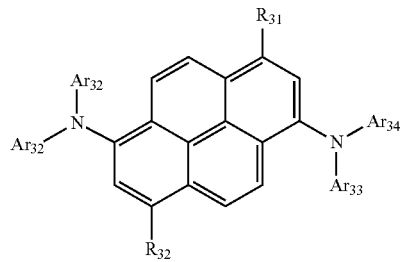

<Chemical Formula Z1>

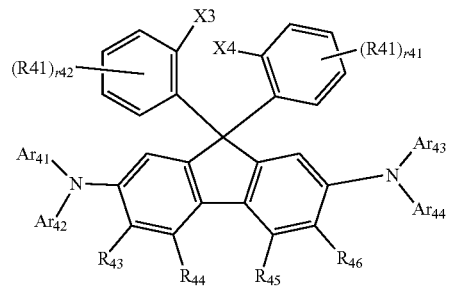

<Chemical Formula Z2> wherein in Chemical Formulae Z1 and Z2:

R31 and R32 are the same as or different from each other, and each independently is hydrogen, deuterium, a substituted or unsubstituted alkyl group, a substituted or unsubstituted silyl group, or a substituted or unsubstituted aryl group;

X3 and X4 are each hydrogen or deuterium, or directly single bond to each other to form a ring;

R41 and R42 are the same as or different from each other, and each independently is hydrogen, deuterium, or a substituted or unsubstituted alkyl group;

R43 to R46 are the same as or different from each other, and each independently is hydrogen, deuterium, a substituted or unsubstituted alkyl group, or a substituted or unsubstituted aryl group, or adjacent substituents bond to each other to form a substituted or unsubstituted ring;

Ar31 to Ar34 and Ar41 to Ar44 are the same as or different from each other, and each independently is a substituted or unsubstituted aryl group or a substituted or unsubstituted heteroaryl group;

r41 and r42 are each an integer of 0 to 4, and when r41 and r42 are 2 or greater, substituents in the parentheses are the same as or different from each other.

In one embodiment of the present specification, the dopant can be selected from among the following structures, but is not limited thereto:

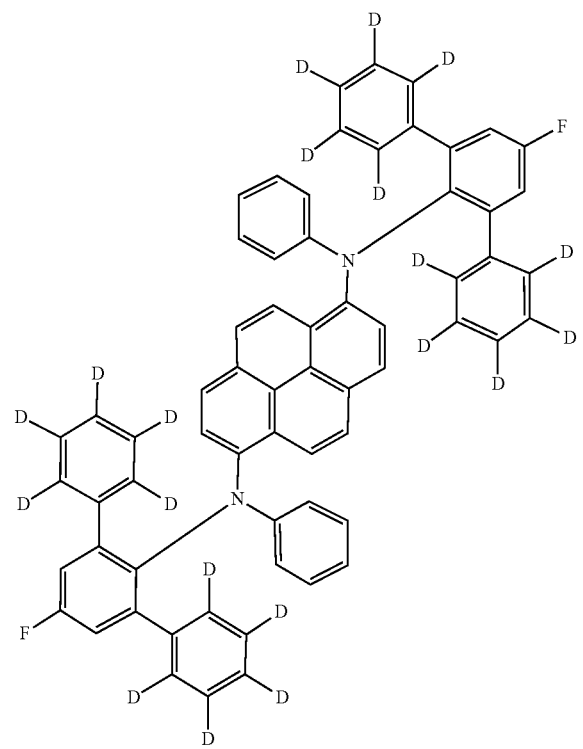

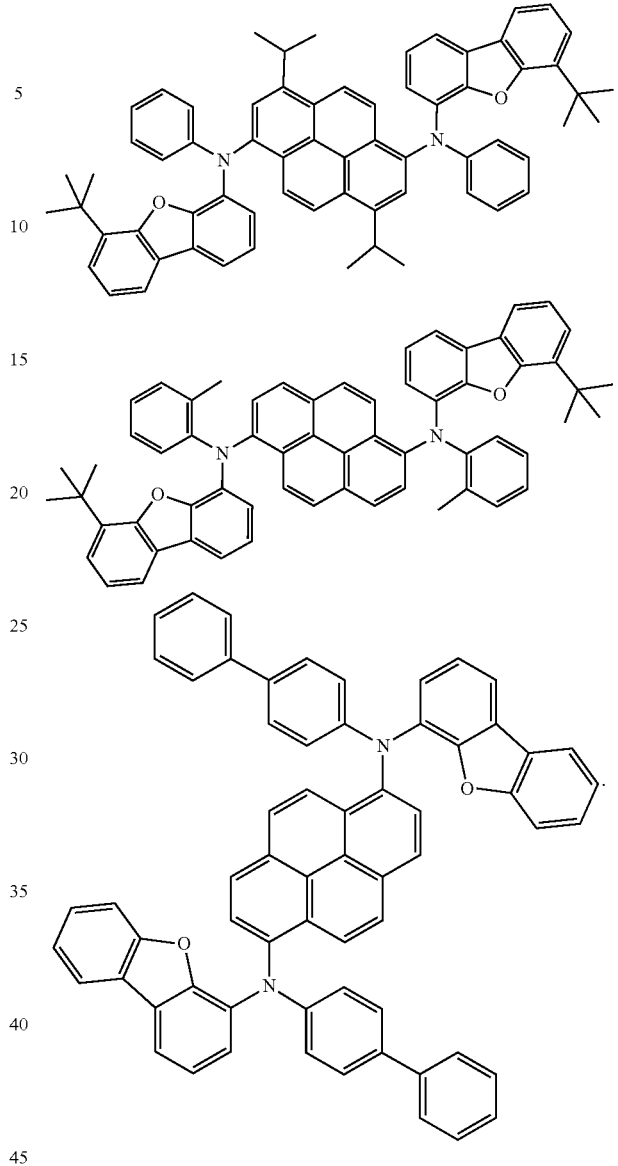

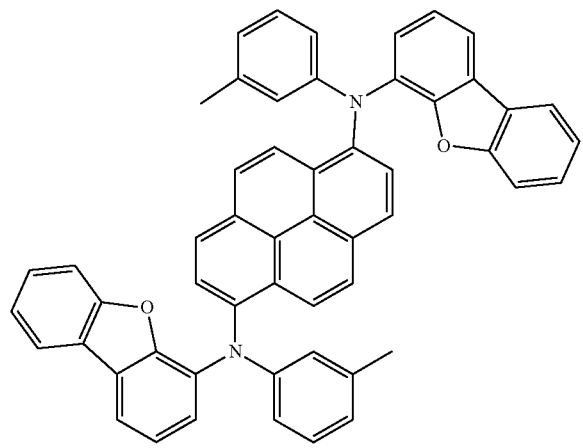

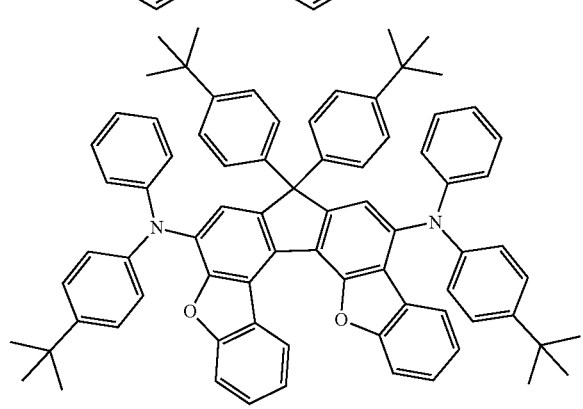

In one embodiment of the present specification, the light emitting layer can include the dopant in 0.1 parts by weight to 50 parts by weight, and preferably in 1 parts by weight to 30 parts by weight based on 100 parts by weight of the host. When the amount is within the above-mentioned range, energy is efficiently transferred from the host to the dopant.

In one embodiment of the present specification, the organic light emitting device further includes one or more light emitting layers. The one or more light emitting layers can each include the dopant described above.

According to one embodiment of the present specification, the organic light emitting device includes two or more light emitting layers, and one of the two or more light emitting layers includes a fluorescent dopant, and the other layer includes a phosphorescent dopant.

One embodiment of the present disclosure includes a light emitting layer including the compound of Chemical Formula 1, and the light emitting layer has a maximum emission peak at 400 nm to 500 nm.

In one embodiment of the present specification, the anthracene compound of Chemical Formula 1 is included in greater than or equal to 50 parts by weight and less than 100 parts by weight, and more preferably in greater than or equal to 70 parts by weight and less than or equal to 99 parts by weight with respect to 100 parts by weight of the total weight of the light emitting layer.

The organic light emitting device according to one embodiment of the present specification includes two or more light emitting layers, and at least one of the two or more light emitting layers includes the anthracene compound of Chemical Formula 1. The light emitting layer including the anthracene compound of Chemical Formula 1 shows a blue color, and the light emitting layer that does not include the anthracene compound of Chemical Formula 1 can include blue, red or green light emitting compounds known in the art.

In one embodiment of the present specification, the organic material layer includes a hole injection layer, a hole transfer layer, an electron blocking layer, an electron injection layer, an electron transfer layer or a hole blocking layer, and the hole injection layer, the hole transfer layer, the electron blocking layer, the electron injection layer, the electron transfer layer or the hole blocking layer includes the anthracene compound of Chemical Formula 1.

In one embodiment of the present specification, the organic material layer further includes one, two or more layers selected from the group consisting of a hole injection layer, a hole transfer layer, a light emitting layer, an electron transfer layer, an electron injection layer, a hole blocking layer and an electron blocking layer.

In one embodiment of the present specification, the first electrode is an anode, and the second electrode is a cathode.

In one embodiment of the present specification, the second electrode is a cathode, and the first electrode is an anode.

In one embodiment of the present specification, the organic light emitting device can be an organic light emitting device having a structure in which an anode, one or more organic material layers and a cathode are consecutively laminated on a substrate (normal type).

In one embodiment of the present specification, the organic light emitting device can be an organic light emitting device having a structure in a reverse direction in which a cathode, one or more organic material layers and an anode are consecutively laminated on a substrate (inverted type).

For example, a structure of the organic light emitting device according to one embodiment of the present specification is illustrated in FIG. 1 and FIG. 2, however, the structure is not limited thereto.

FIG. 1 illustrates a structure of the organic light emitting device in which an anode (102), a light emitting layer (106) and a cathode (110) are consecutively laminated on a substrate (101). The compound of Chemical Formula 1 is included in the light emitting layer.

FIG. 2 illustrates a structure of the organic light emitting device in which an anode (102), a hole injection layer (103), a hole transfer layer (104), an electron blocking layer (105), a light emitting layer (106), an electron transfer layer (107), an electron injection layer (108) and a cathode (110) are consecutively laminated on a substrate (101). The compound of Chemical Formula 1 is included in the light emitting layer.

The organic light emitting device of the present specification can be manufactured using materials and methods known in the art, except that the organic material layer includes the compound.

When the organic light emitting device includes a plurality of organic material layers, the organic material layers can be formed with the same materials or different materials.

For example, the organic light emitting device of the present specification can be manufactured by consecutively laminating an anode, an organic material layer and a cathode on a substrate. Herein, the organic light emitting device can be manufactured by forming an anode on a substrate by depositing a metal, a metal oxide having conductivity, or an alloy thereof using a physical vapor deposition (PVD) method such as sputtering or e-beam evaporation, and forming an organic material layer including a hole injection layer, a hole transfer layer, a light emitting layer and an electron transfer layer thereon, and then depositing a material capable of being used as a cathode thereon. In addition to such a method, the organic light emitting device can also be manufactured by consecutively depositing a cathode material, an organic material layer and an anode material on a substrate.

In addition, the anthracene compound of Chemical Formula 1 can be formed into an organic material layer using a solution coating method as well as a vacuum deposition method when manufacturing the organic light emitting device. Herein, the solution coating method means spin coating, dip coating, doctor blading, inkjet printing, screen printing, a spray method, roll coating and the like, but is not limited thereto.

In addition to such a method, the organic light emitting device can also be manufactured by consecutively laminating a cathode material, an organic material layer and an anode material on a substrate. However, the manufacturing method is not limited thereto.

As the anode material, materials having large work function are normally preferred so that hole injection to an organic material layer is smooth. Examples thereof include metals such as vanadium, chromium, copper, zinc and gold, or alloys thereof; metal oxides such as zinc oxide, indium oxide, indium tin oxide (ITO) and indium zinc oxide (IZO); combinations of metals and oxides such as ZnO:Al or $SnO_2$:Sb; conductive polymers such as poly(3-methylthiophene), poly[3,4-(ethylene-1,2-dioxy)thiophene] (PEDOT), polypyrrole and polyaniline, but are not limited thereto.

As the cathode material, materials having small work function are normally preferred so that electron injection to an organic material layer is smooth. Examples thereof include metals such as magnesium, calcium, sodium, potassium, titanium, indium, yttrium, lithium, gadolinium, aluminum, silver, tin and lead, or alloys thereof; multilayer structure materials such as LiF/Al or $LiO_2$/Al, and the like, but are not limited thereto.

The light emitting layer can include a host material and a dopant material. The host material includes fused aromatic ring derivatives, heteroring-containing compounds or the like. Specifically, the fused aromatic ring derivative includes anthracene derivatives, pyrene derivatives, naphthalene derivatives, pentacene derivatives, phenanthrene compounds, fluoranthene compounds and the like, and the heteroring-containing compound includes dibenzofuran derivatives, ladder-type furan compounds, pyrimidine derivatives and the like, however, the material is not limited thereto.

The dopant material includes aromatic amine derivatives, styrylamine compounds, boron complexes, fluoranthene compounds, metal complexes and the like. Specifically, the aromatic amine derivative is a fused aromatic ring derivative having a substituted or unsubstituted arylamine group and includes arylamine group-including pyrene, anthracene, chrysene, peryflanthene and the like. In addition, the styrylamine compound is a compound in which substituted or unsubstituted arylamine is substituted with at least one arylvinyl group, and one, two or more substituents selected from the group consisting of an aryl group, a silyl group, an alkyl group, a cycloalkyl group and an arylamine group are substituted or unsubstituted. Specifically, styrylamine, styryldiamine, styryltriamine, styryltetramine or the like is included, however, the styrylamine compound is not limited thereto. In addition, the metal complex includes iridium complexes, platinum complexes or the like, but is not limited thereto.

The hole injection layer is a layer receiving holes from an electrode. The hole injection material preferably has, by having an ability to transfer holes, a hole receiving effect from an anode and an excellent hole injection effect for a light emitting layer or a light emitting material. In addition, the hole injection material is preferably a material having an excellent ability to prevent excitons generated in the light emitting layer from moving to an electron injection layer or an electron injection material. In addition, a material having an excellent thin film forming ability is preferred. In addition, the highest occupied molecular orbital (HOMO) of the hole injection material is preferably in between the work function of an anode material and the HOMO of surrounding organic material layers. Specific examples of the hole injection material include metal porphyrins, oligothiophene, arylamine-based organic materials; hexanitrile hexaazatriphenylene-based organic materials; quinacridone-based organic materials; perylene-based organic materials; polythiophene-based conductive polymers such as anthraquinone or polyaniline, and the like, but are not limited thereto.

The hole transfer layer is a layer receiving holes from a hole injection layer and transferring the holes to a light emitting layer, and can have a single layer structure or a multilayer structure of two or more layers. As the hole transfer material, materials having, as a material capable of receiving holes from an anode or a hole injection layer and moving the holes to a light emitting layer, high mobility for the holes are preferred. Specific examples thereof include arylamine-based organic materials, conductive polymers, block copolymers having conjugated parts and non-conjugated parts together, and the like, but are not limited thereto.

In one embodiment of the present specification, the hole transfer layer has a multilayer structure of two or more layers. Specifically, the hole transfer layer has a two-layer structure.

The electron transfer layer is a layer receiving electrons from an electron injection layer and transferring the electrons to a light emitting layer. As the electron transfer material, materials capable of favorably receiving electrons from a cathode, moving the electrons to a light emitting layer, and having high mobility for the electrons are preferred. Specific examples thereof include Al complexes of 8-hydroxyquinoline; complexes including $Alq_3$; organic radical compounds; hydroxyflavon-metal complexes, and the like, but are not limited thereto. The electron transfer layer can be used together with any desired cathode material as used in the art. Particularly, the suitable cathode material is a common material having low work function and having an aluminum layer or a silver layer following. Specifically, cesium, barium, calcium, ytterbium, samarium and the like are included, and in each case, an aluminum layer or a silver layer follows.

The electron injection layer is a layer receiving electrons from an electrode. As the electron injection material, materials having an excellent electron transferring ability, having an electron receiving effect from a second electrode, and having an excellent electron injection effect for a light emitting layer or light emitting material are preferred. In addition, materials preventing excitons generated in the light emitting layer from moving to a hole injection layer, and having an excellent thin film forming ability are preferred. Specific examples thereof include fluorenone, anthraquinodimethane, diphenoquinone, thiopyran dioxide, oxazole, oxadiazole, triazole, imidazole, perylene tetracarboxylic acid, fluorenylidene methane, anthrone or the like, and derivatives thereof, metal complex compounds, nitrogen-containing 5-membered ring derivatives, and the like, but are not limited thereto.

The metal complex compound includes 8-hydroxyquinolinato lithium, bis(8-hydroxyquinolinato)zinc, bis(8-hydroxy-quinolinato)copper, bis(8-hydroxyquinolinato)manganese, tris(8-hydroxyquinolinato)aluminum, tris(2-methyl-8-hydroxy-quinolinato)aluminum, tris(8-hydroxyquinolinato)gallium, bis(10-hydroxybenzo[h]quinolinato)beryllium, bis(10-hydroxybenzo[h]quinolinato)zinc, bis(2-methyl-8-quinolinato)-chloro-gallium, bis(2-methyl-8-quinolinato) (o-cresolato)-gallium, bis(2-methyl-8-quinolinato) (1-naphtholato)aluminum, bis(2-methyl-8-quinolinato) (2-naphtholato)gallium and the like, but is not limited thereto.

The electron blocking layer is a layer capable of enhancing lifetime and efficiency of a device by preventing electrons injected from an electron injection layer from passing through a light emitting layer and entering a hole injection layer. Known material can be used without limit, and the electron blocking layer can be formed between the light emitting layer and the hole injection layer, or between the light emitting layer and a layer carrying out hole injection and hole transfer at the same time.

The hole blocking layer is a layer blocking holes from reaching a cathode, and can be generally formed under the same condition as the electron injection layer. Specific examples thereof can include oxadiazole derivatives, triazole derivatives, phenanthroline derivatives, aluminum complexes and the like, but are not limited thereto.

The organic light emitting device according to the present specification can be a top-emission type, a bottom-emission type or a dual-emission type depending on the materials used.

EXAMPLES

Hereinafter, the present specification will be described in detail with reference to examples, comparative examples and the like. However, the examples and the comparative examples according to the present specification can be modified to various other forms, and the scope of the present specification is not to be construed as being limited to the examples and the comparative examples described below. Examples and comparative examples of the present specification are provided in order to more fully describe the present specification to those having average knowledge in the art.

Preparation Examples

(Preparation Example 1) Preparation of Compound 1

(Preparation Example 1-1) Preparation of Compound A-2

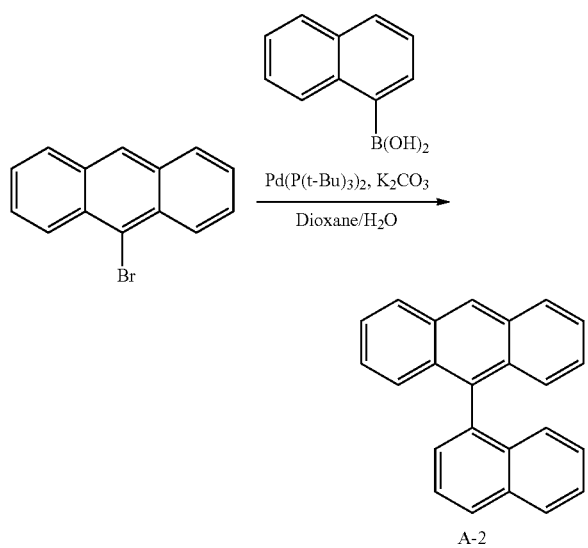

After dissolving 9-bromoanthracene (50.0 g, 194 mmol) and naphthalene-1-boronic acid (36.79 g, 214 mmol) in 1,4-dioxane (500 ml) in a three-neck flask, $K_2CO_3$ (80.6 g, 583 mmol) dissolved in $H_2O$ (200 ml) was introduced thereto. $Pd(P(t-Bu)_3)_2$ (1.98 g, 3.9 mmol) was introduced thereto, and the result was stirred for 5 hours under reflux under the argon atmosphere. When the reaction was finished, the result was cooled to room temperature, and the reaction solution was transferred to a separatory funnel and extracted with water and toluene. The extract was dried with $MgSO_4$, filtered and concentrated, and then the sample was purified using silica gel column chromatography to obtain Compound A-2 (50.1 g, yield 85%, MS[M+H]+=305).

(Preparation Example 1-2) Preparation of Compound A-1

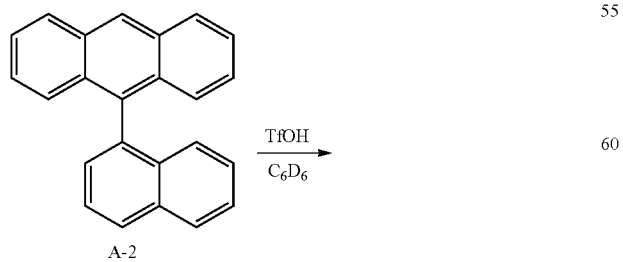

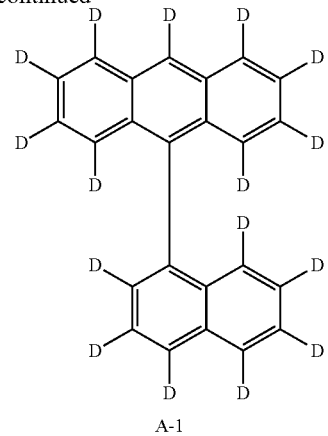

Synthesized Compound A-2 (20 g) and TfOH (2 ml) were introduced to $C_6D_6$ (200 ml), and stirred for 30 minutes. After the reaction was finished, $D_2O$ (50 ml) was introduced thereto, the result was stirred for 30 minutes, and then trimethylamine (6 ml) was added dropwise thereto. The reaction solution was transferred to a separatory funnel, and extracted with water and toluene. The extract was dried with $MgSO_4$, and then recrystallized with ethyl acetate to obtain Compound A-1 (20.3 g, yield 96%, MS[M+H]+=320).

(Preparation Example 1-3) Preparation of Compound A

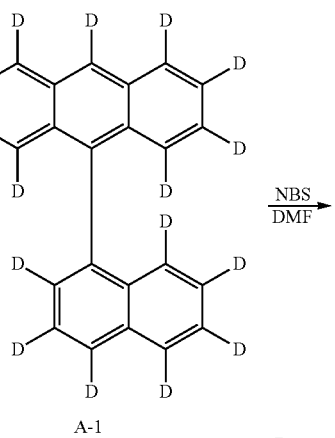

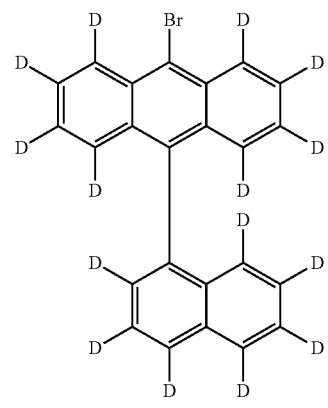

After introducing Compound A-1 (20.0 g, 62.4 mmol), N-bromosuccinimide (NBS) (11.66 g, 65.5 mmol) and dimethylformamide (DMF) (300 ml) to a two-neck flask, the result was stirred for 8 hours at room temperature under the argon atmosphere. After the reaction was finished, the reaction solution was transferred to a separatory funnel, and the organic layer was extracted with water and ethyl acetate. The extract was dried with $MgSO_4$, filtered and concentrated, and then purified with ethyl acetate to obtain Compound A (22.3 g, yield 90%, MS[M+H]+=398).

(Preparation Example 1-4) Preparation of Compound 1

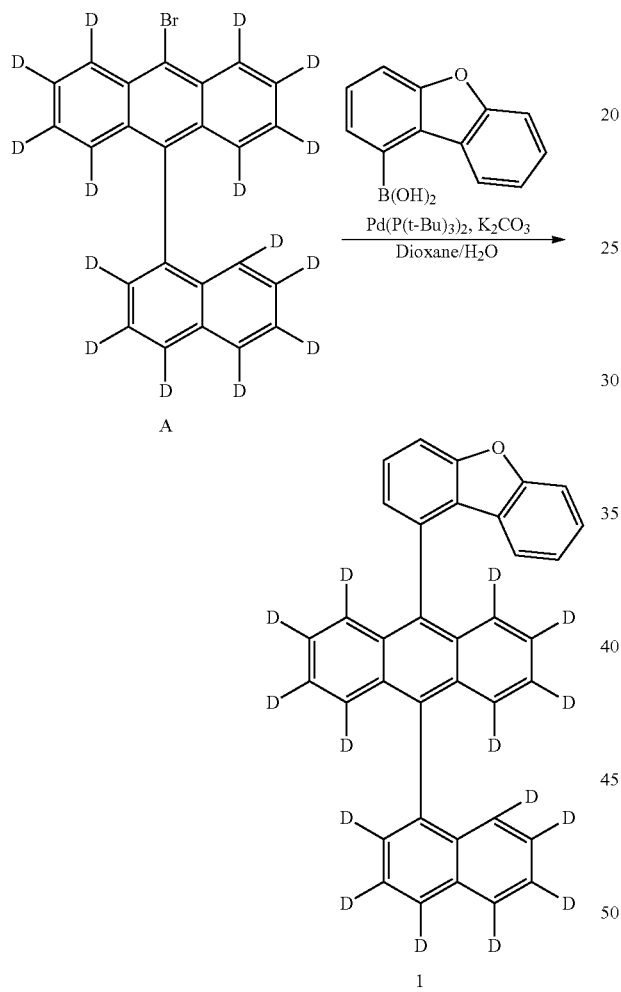

After dissolving Compound A (20.0 g, 62.4 mmol) and dibenzofuran-1-boronic acid (14.5 g, 68.6 mmol) in 1,4-dioxane (300 ml) in a three-neck flask, $K_2CO_3$ (25.9 g, 187 mmol) dissolved in $H_2O$ (100 ml) was introduced thereto. $Pd(P(t-Bu)_3)_2$ (0.64 g, 1.2 mmol) was introduced thereto, and the result was stirred for 5 hours under reflux under the argon atmosphere. When the reaction was finished, the result was cooled to room temperature, and the reaction solution was transferred to a separatory funnel and extracted with water and toluene. The extract was dried with $MgSO_4$, filtered and concentrated, and then the sample was purified using silica gel column chromatography to obtain Compound 1 (13.2 g, yield 44%, MS[M+H]+=486)

(Preparation Example 2) Preparation of Compound 2

(Preparation Example 2-1) Preparation of Compound B-2

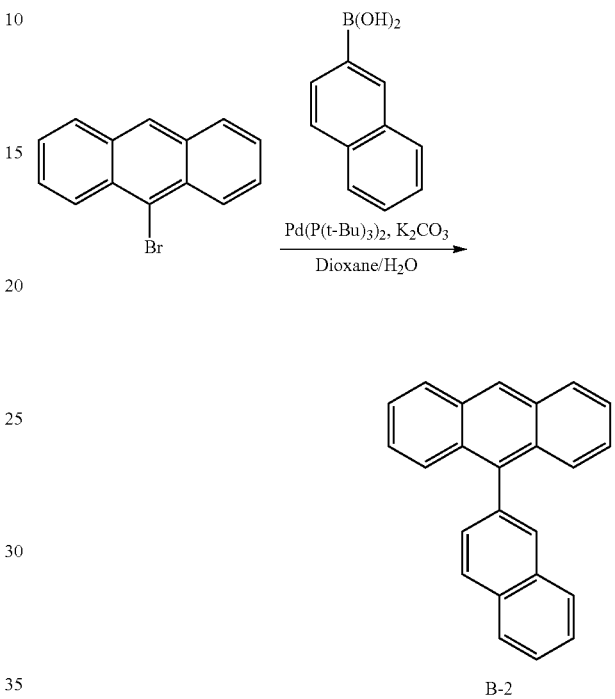

Compound B-2 (48.8 g, yield 83%, MS[M+H]+=305) was obtained in the same manner as in Preparation Example 1-1 except that naphthalene-2-boronic acid was used instead of naphthalene-1-boronic acid.

(Preparation Example 2-2) Preparation of Compound B-1

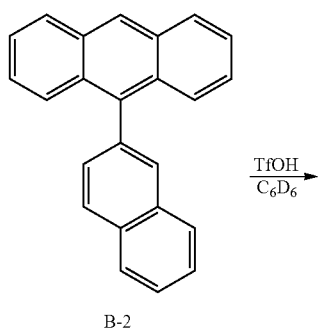

49

-continued

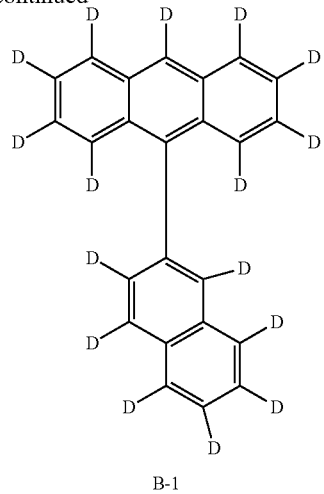

B-1

Compound B-1 (19.1 g, yield 91%, MS[M+H]+=320) was obtained in the same manner as in Preparation Example 1-2.

(Preparation Example 2-3) Preparation of Compound B

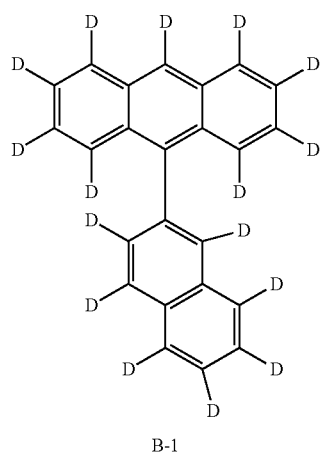

B-1

$\xrightarrow{\text{NBS}}{\text{DMF}}$

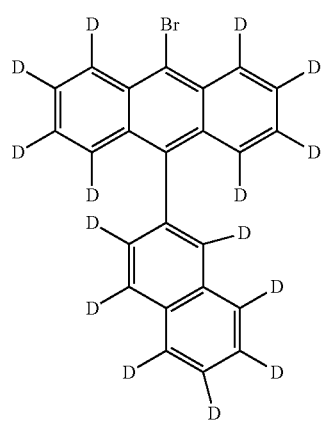

B

Compound B (21.9 g, yield 88%, MS[M+H]+=320) was obtained in the same manner as in Preparation Example 1-3.

50

(Preparation Example 2-4) Preparation of Compound 2

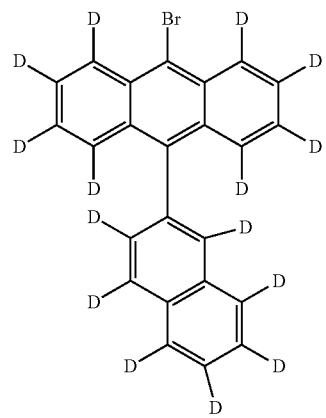 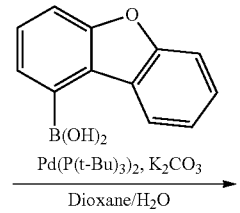

B $\xrightarrow{\text{Pd(P(t-Bu)}_3)_2, \text{K}_2\text{CO}_3}{\text{Dioxane/H}_2\text{O}}$

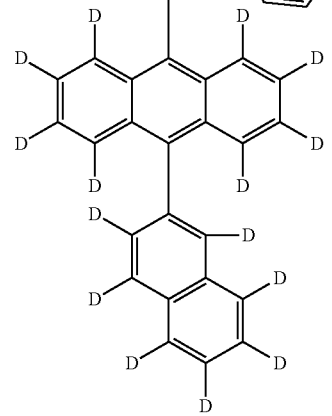

2

Compound 2 (12.9 g, yield 42%, MS[M+H]+=486) was obtained in the same manner as in Preparation Example 1-4.

(Preparation Example 3) Preparation of Compound 3

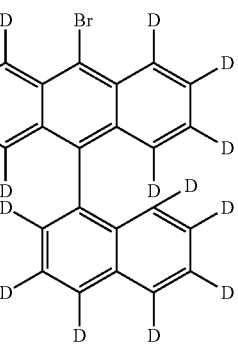 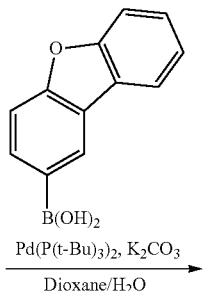

A $\xrightarrow{\text{Pd(P(t-Bu)}_3)_2, \text{K}_2\text{CO}_3}{\text{Dioxane/H}_2\text{O}}$ -continued

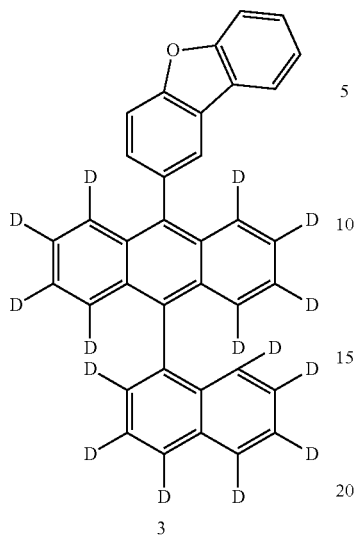

3

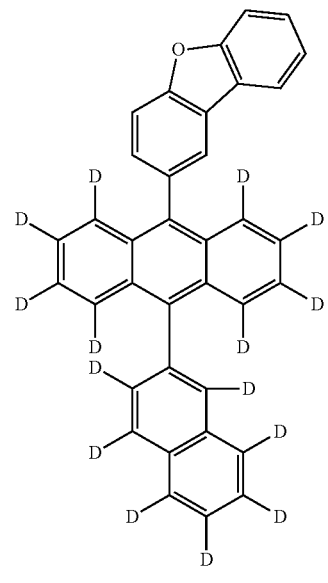

4

Compound 3 (15.1 g, yield 50%, MS[M+H]+=486) was obtained in the same manner as in Preparation Example 1-4 except that dibenzofuran-2-boronic acid was used instead of dibenzofuran-1-boronic acid.

(Preparation Example 4) Preparation of Compound 4

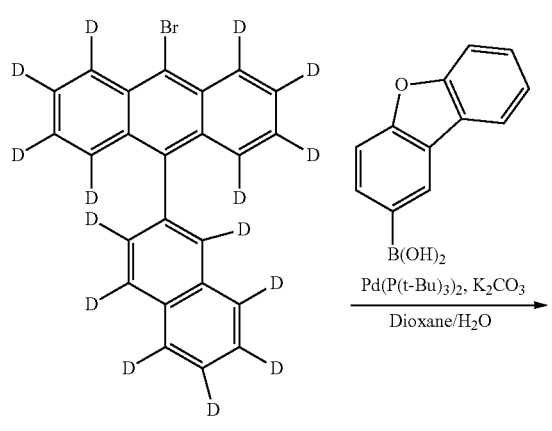

Compound 4 (13.0 g, yield 43%, MS[M+H]+=486) was obtained in the same manner as in Preparation Example 2-4 except that dibenzofuran-2-boronic acid was used instead of dibenzofuran-1-boronic acid.

(Preparation Example 5) Preparation of Compound 5

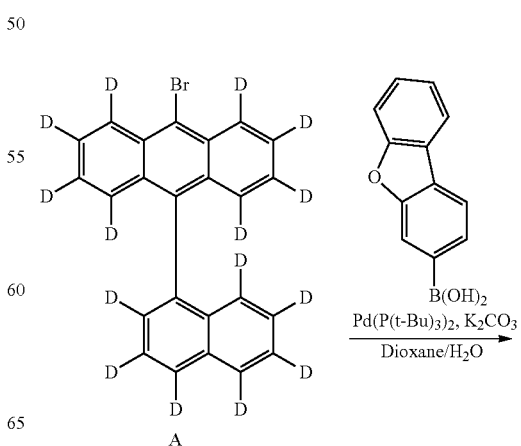

-continued

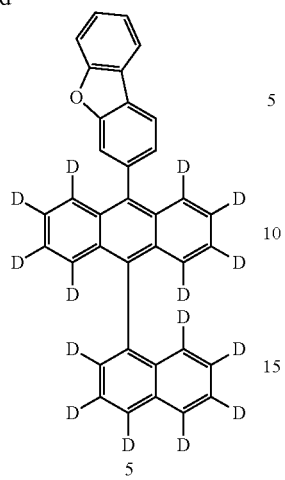

5

Compound 5 (15.6 g, yield 52%, MS[M+H]+=486) was obtained in the same manner as in Preparation Example 1-4 except that dibenzofuran-3-boronic acid was used instead of dibenzofuran-1-boronic acid.

(Preparation Example 6) Preparation of Compound 6

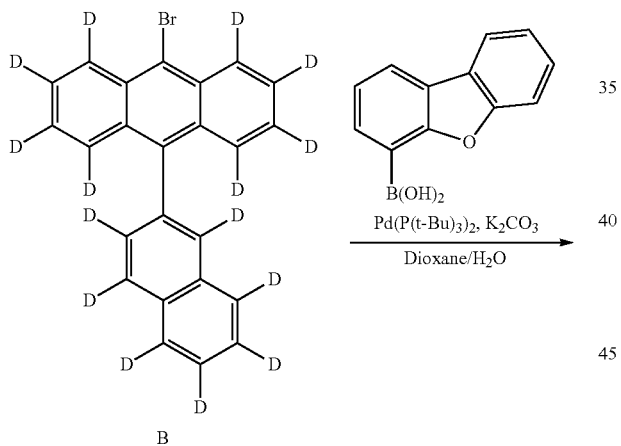

B

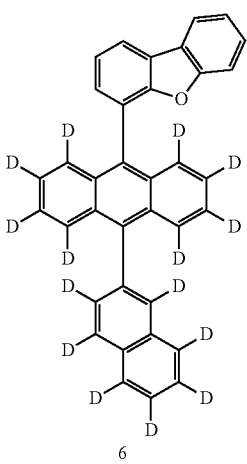

6

Compound 6 (13.9 g, yield 46%, MS[M+H]+=486) was obtained in the same manner as in Preparation Example 2-4 except that dibenzofuran-4-boronic acid was used instead of dibenzofuran-1-boronic acid.

(Preparation Example 7) Preparation of Compound 7

(Preparation Example 7-1) Preparation of Compound C

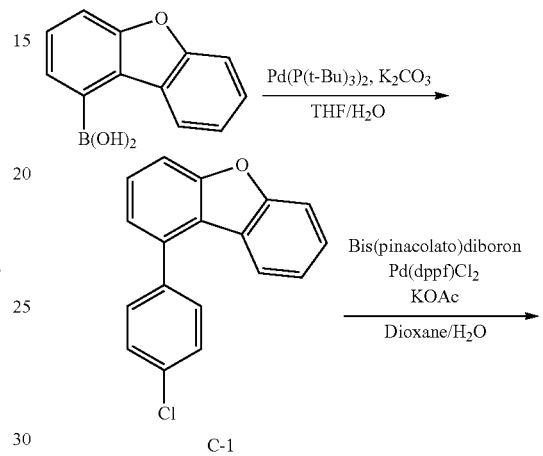

C-1

C

After dissolving dibenzofuran-1-boronic acid (20.0 g, 94.3 mmol) and 1-bromo-4-chlorobenzene (18.1 g, 94.3 mmol) in THF (300 ml) in a three-neck flask, $K_2CO_3$ (39.1 g, 283 mmol) dissolved in $H_2O$ (100 ml) was introduced thereto. Pd(P(t-Bu) 3)$_2$ (0.96 g, 1.9 mmol) was introduced thereto, and the result was stirred for 2 hours under reflux under the argon atmosphere. When the reaction was finished, the result was cooled to room temperature, and the reaction solution was transferred to a separatory funnel and extracted with water and toluene. The extract was dried with $MgSO_4$, filtered and concentrated, and then the next reaction proceeded immediately.

After dissolving the C-1 mixture, bis(pinacolato)diboron (28.7 g, 113 mmol) and KOAc (27.8 g, 283 mmol) in 1,4-dioxane (300 ml) in a three-neck flask, Pd(dppf)Cl$_2$ (1.38 g, 1.89 mmol) was introduced thereto, and the result was stirred for 12 hours under reflux under the argon atmosphere. When the reaction was finished, the result was cooled to room temperature, and the reaction solution was concentrated and then extracted with water and chloroform.

The extract was dried with MgSO₄, filtered and concentrated, and then the sample was purified using silica gel column chromatography to obtain Compound C (23.3 g, overall yield 67%, MS[M+H]+=371).

(Preparation Example 7-2) Preparation of Compound 7

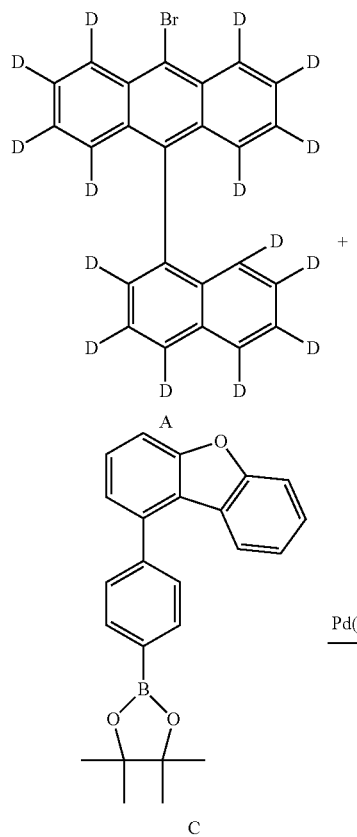

After dissolving Compound A (20.0 g, 50.2 mmol) and Compound C (20.5 g, 55.2 mmol) in 1,4-dioxane (300 ml) in a three-neck flask, K₂CO₃ (20.8 g, 151 mmol) dissolved in H₂O (100 ml) was introduced thereto. Pd(P(t-Bu)₃)₂ (0.51 g, 1.0 mmol) was introduced thereto, and the result was stirred for 3 hours under reflux under the argon atmosphere. When the reaction was finished, the result was cooled to room temperature, and the reaction solution was transferred to a separatory funnel and extracted with water and toluene. The extract was dried with MgSO₄, filtered and concentrated, and then the sample was purified using silica gel column chromatography to obtain Compound 7 (16.6 g, yield 58%, MS [M+H]+=562).

(Preparation Example 8) Preparation of Compound 8

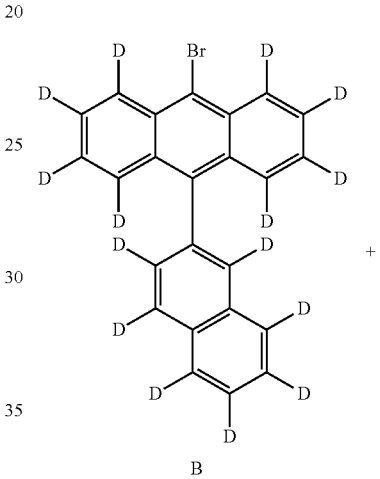

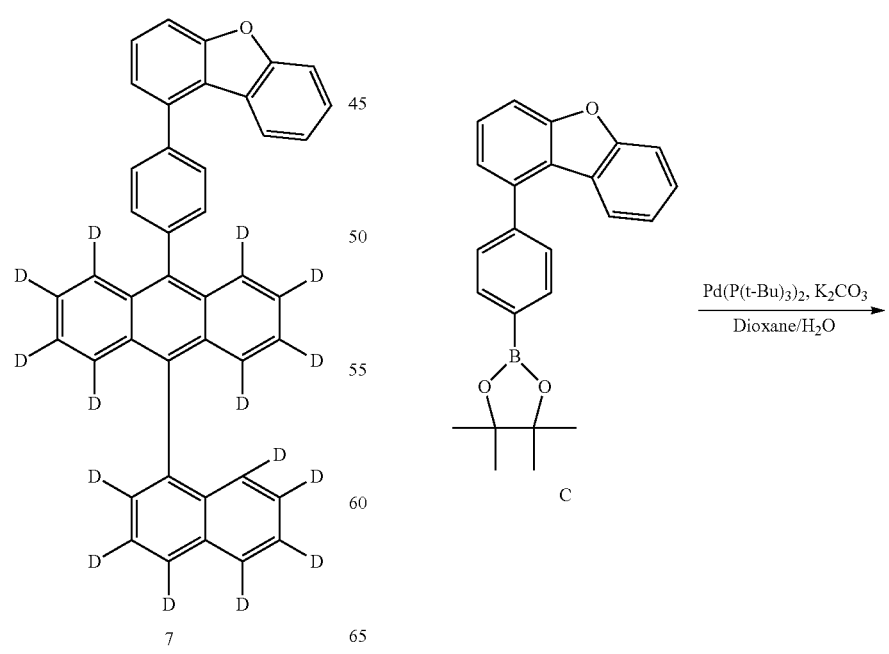

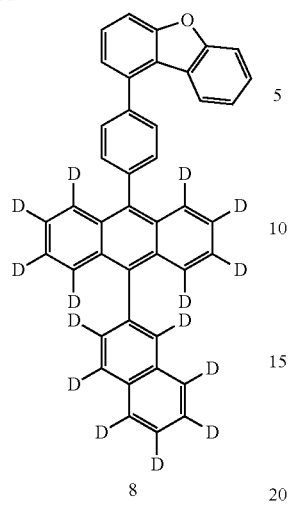
8
Compound 8 (14.7 g, yield 52%, MS[M+H]+=562) was obtained in the same manner as in Preparation Example 7-2.
(Preparation Example 9) Preparation of Compound 9
(Preparation Example 9-1) Preparation of Compound D
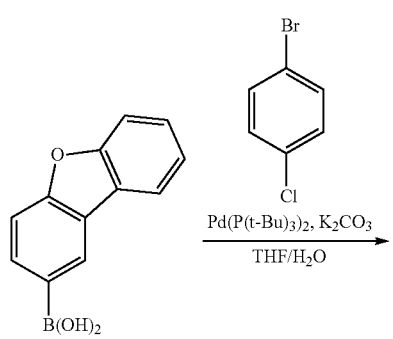
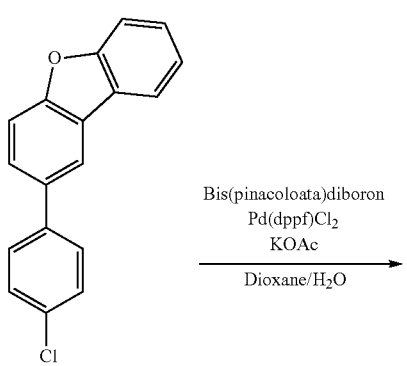
D-1
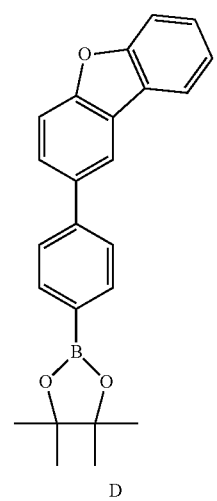
D
Compound D (24.1 g, overall yield 69%, MS[M+H]+ =371) was obtained in the same manner as in Preparation Example 7-1.
(Preparation Example 9-2) Preparation of Compound 9
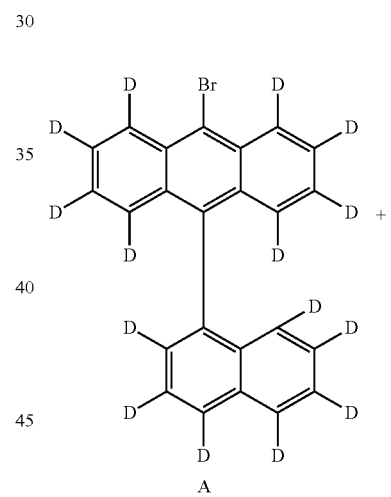
A
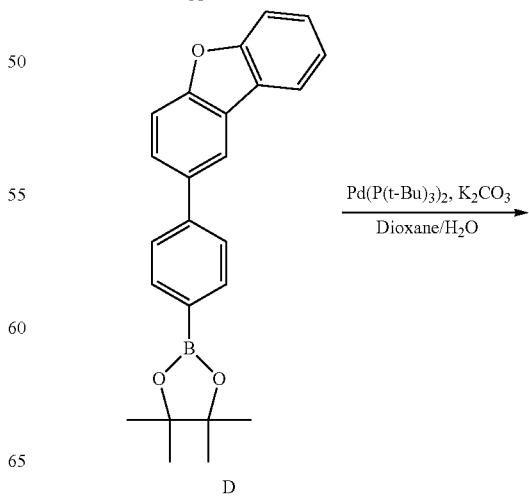
D -continued
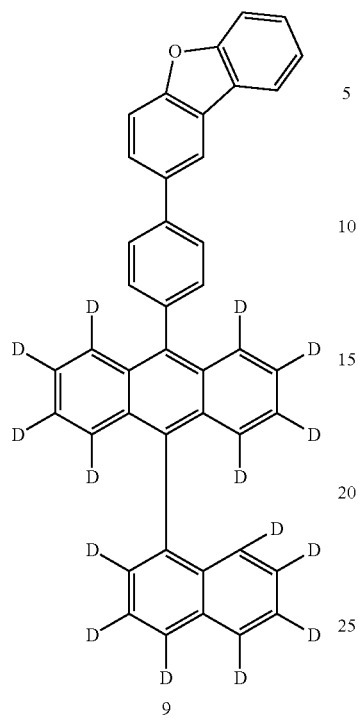
9
Compound 9 (13.3 g, yield 47%, MS[M+H]+=562) was obtained in the same manner as in Preparation Example 7-2.
(Preparation Example 10) Preparation of Compound 10
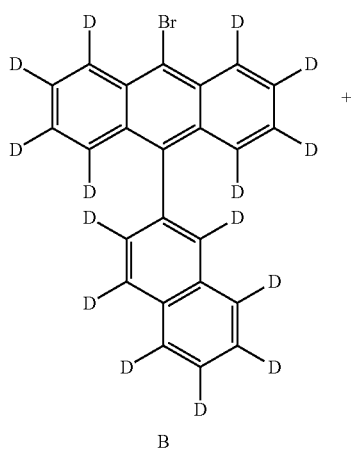
B
-continued
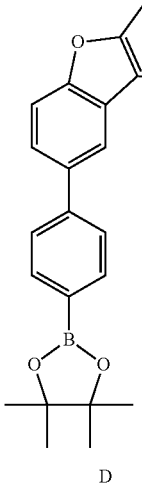
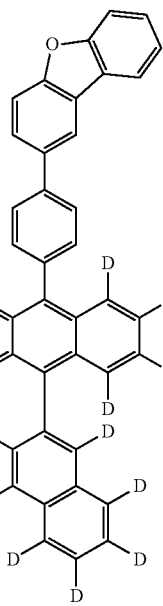
10
Compound 10 (12.9 g, yield 46%, MS[M+H]+=562) was obtained in the same manner as in Preparation Example 8-2.
(Preparation Example 11) Preparation of Compound 11
(Preparation Example 11-1) Preparation of Compound E
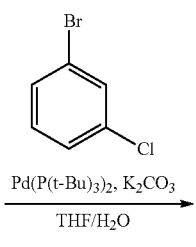

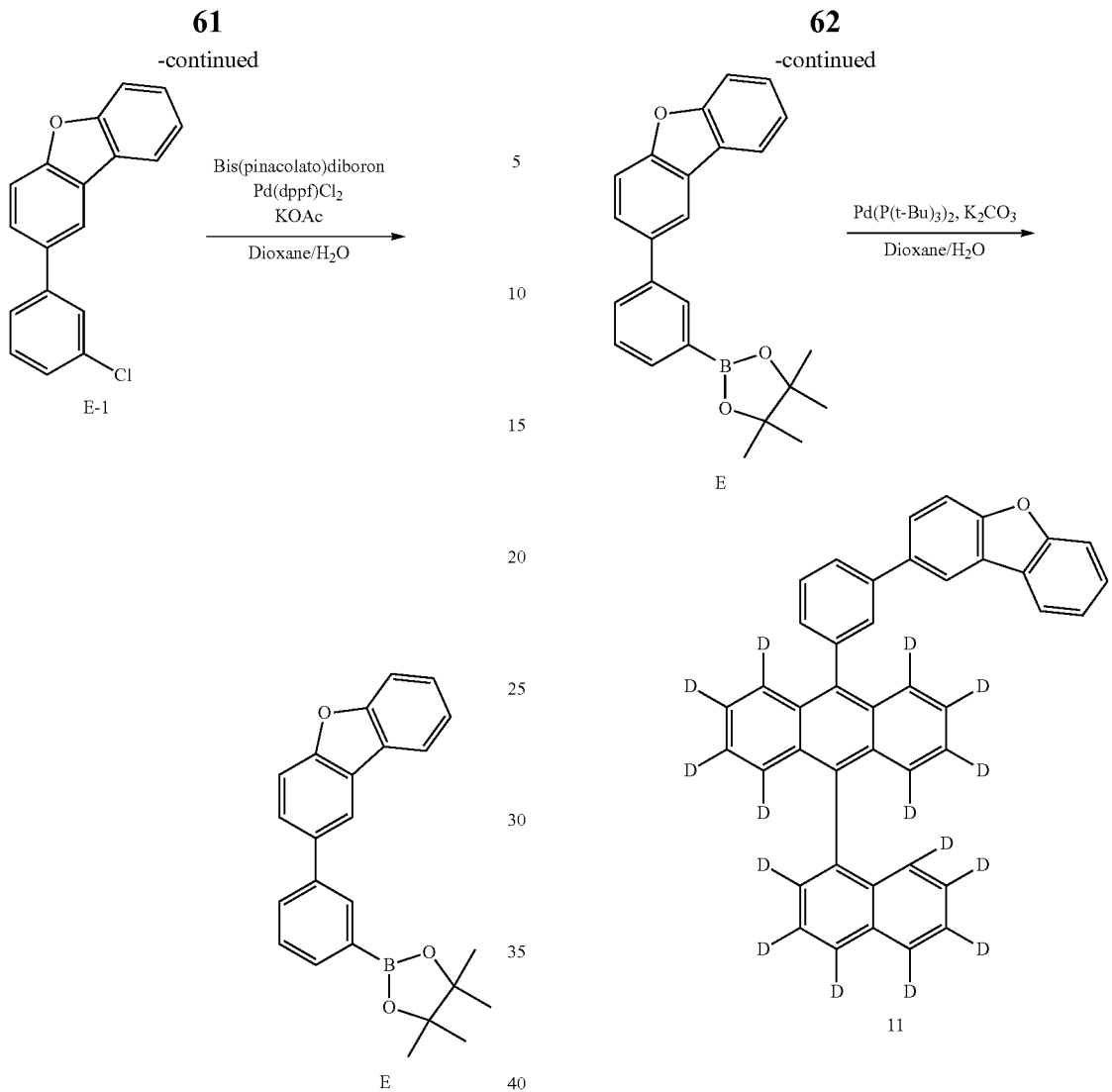
Compound E (26.4 g, overall yield 76%, MS[M+H]+=371) was obtained in the same manner as in Preparation Example 7-1.
(Preparation Example 11-2) Preparation of Compound 11
Compound 11 (14.1 g, overall yield 50%, MS[M+H]+=562) was obtained in the same manner as in Preparation Example 7-2.
(Preparation Example 12) Preparation of Compound 12
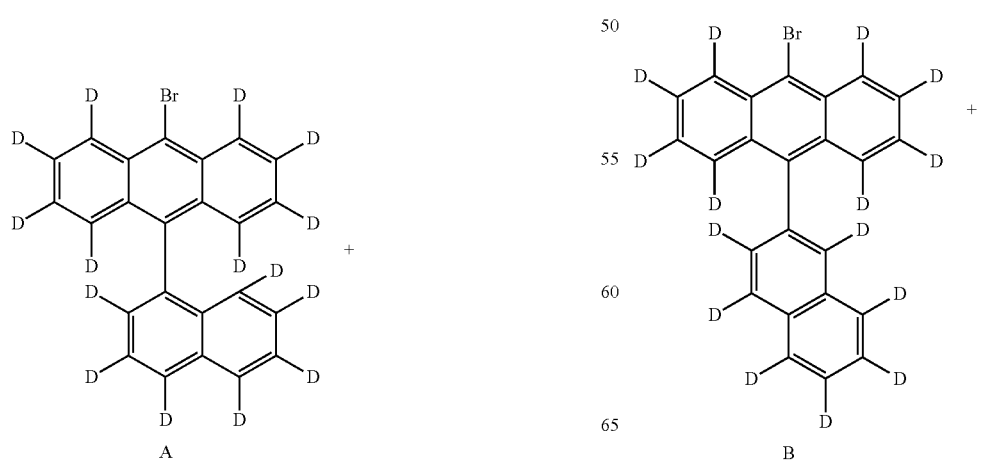

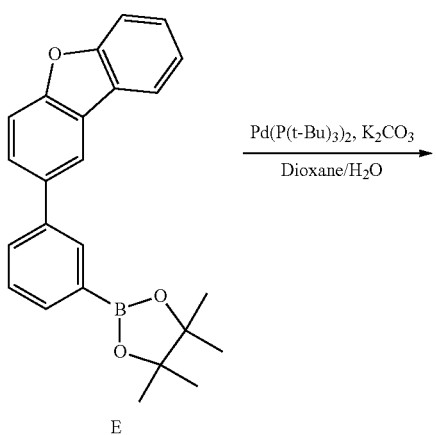
E
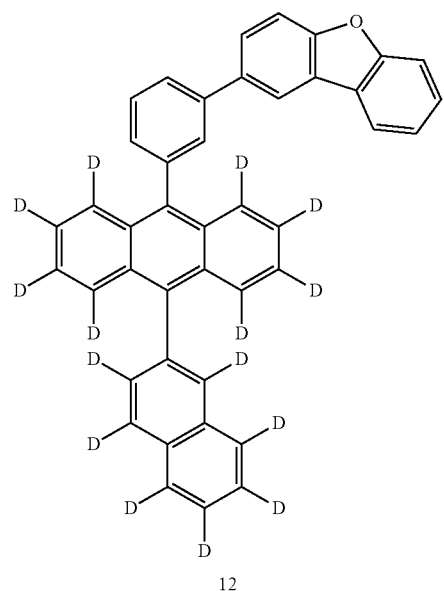
12
Compound 12 (13.0 g, overall yield 46%, MS[M+H]+=562) was obtained in the same manner as in Preparation Example 9-2.
(Preparation Example 13) Preparation of Compound 13
(Preparation Example 13-1) Preparation of Compound F
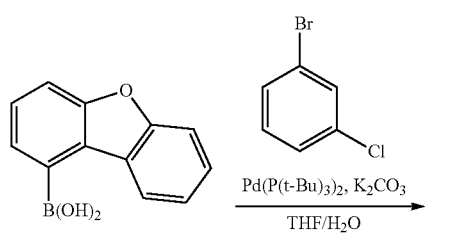
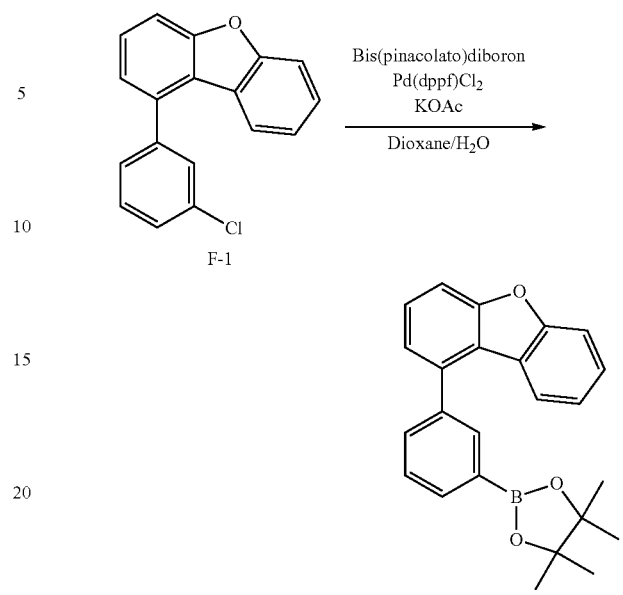
F-1
F
Compound F (25.5 g, overall yield 73%, MS[M+H]+=371) was obtained in the same manner as in Preparation Example 9-1.
(Preparation Example 13-2) Preparation of Compound 13
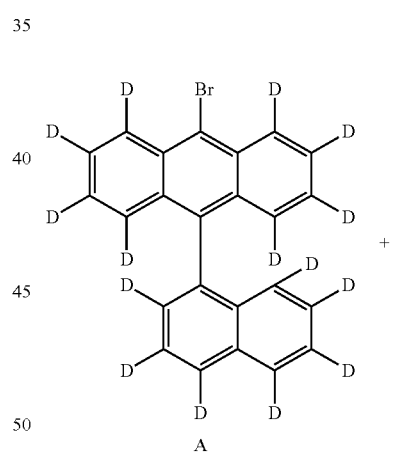
A
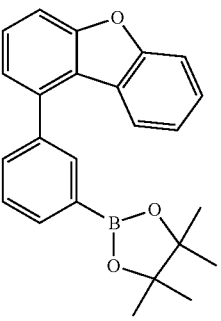
F

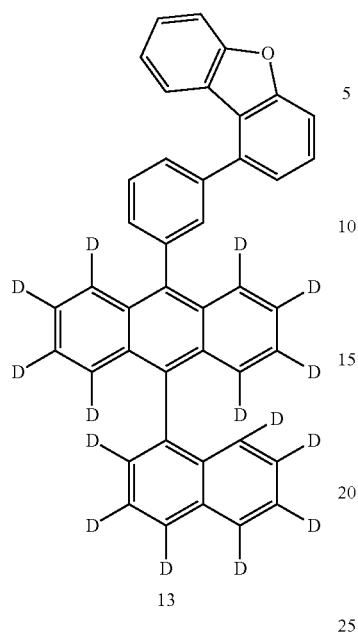
13
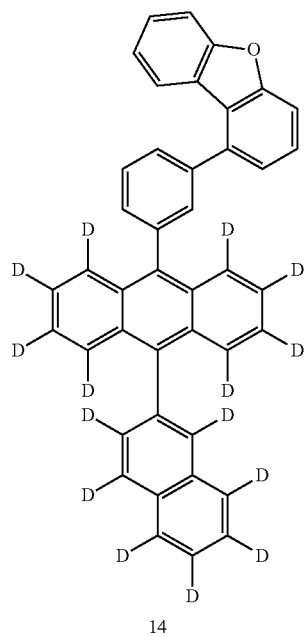
14
Compound 13 (11.2 g, overall yield 32%, MS[M+H]+=562) was obtained in the same manner as in Preparation Example 9-2.
(Preparation Example 14) Synthesis of Compound 14
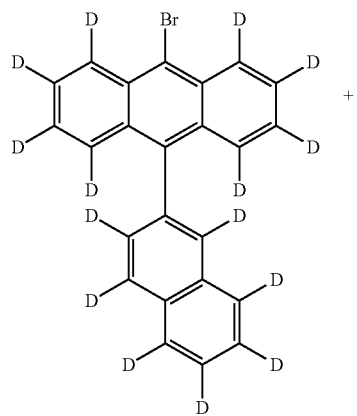
B
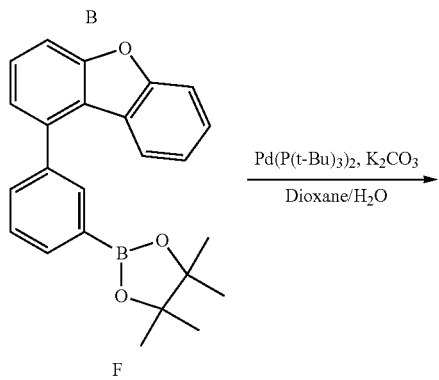
F
Compound 14 (12.0 g, overall yield 42%, MS[M+H]+=562) was obtained in the same manner as in Preparation Example 7-2.
(Preparation Example 15) Synthesis of Compound 15
(Preparation Example 15-1) Synthesis of Compound G
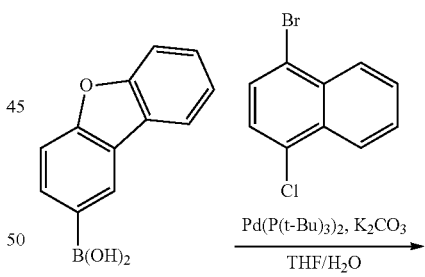
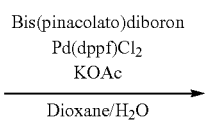
G-1

-continued

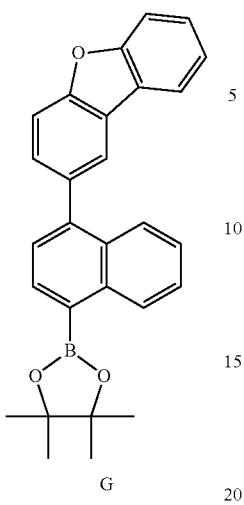

G

Compound G (28.6 g, overall yield 72%, MS[M+H]+=421) was obtained in the same manner as in Preparation Example 7-1.

(Preparation Example 15-2) Preparation of Compound 15

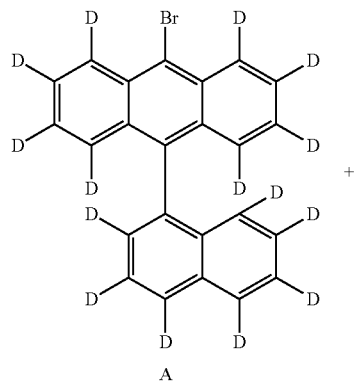

A

+

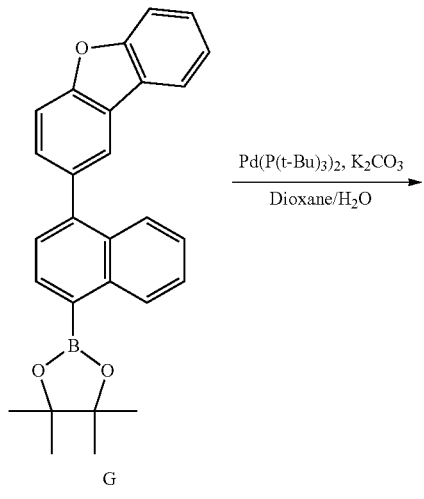

G

-continued

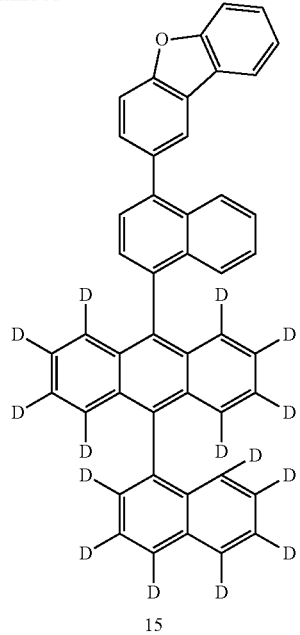

15

Compound 15 (14.8 g, overall yield 48%, MS[M+H]+=612) was obtained in the same manner as in Preparation Example 7-2.

(Preparation Example 16) Synthesis of Compound 16

(Preparation Example 16-1) Synthesis of Compound H

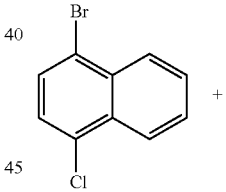

+

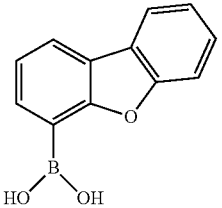

Pd(P(t-Bu)₃)₂, K₂CO₃
———————————→
Dioxane/H₂O

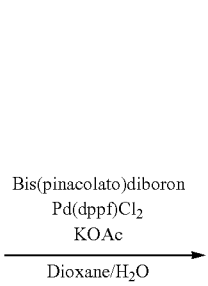

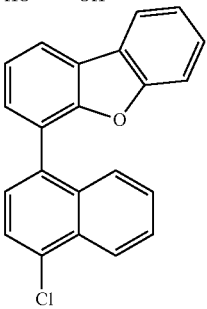

H-1

Bis(pinacolato)diboron
Pd(dppf)Cl₂
KOAc
———————————→
Dioxane/H₂O

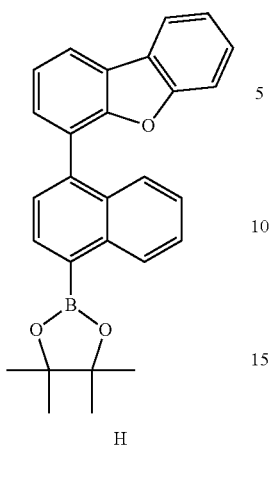

Compound H (18.3 g, overall yield 46%, MS[M+H]+=421) was obtained in the same manner as in Preparation Example 7-1.

(Preparation Example 16-2) Synthesis of Compound 16

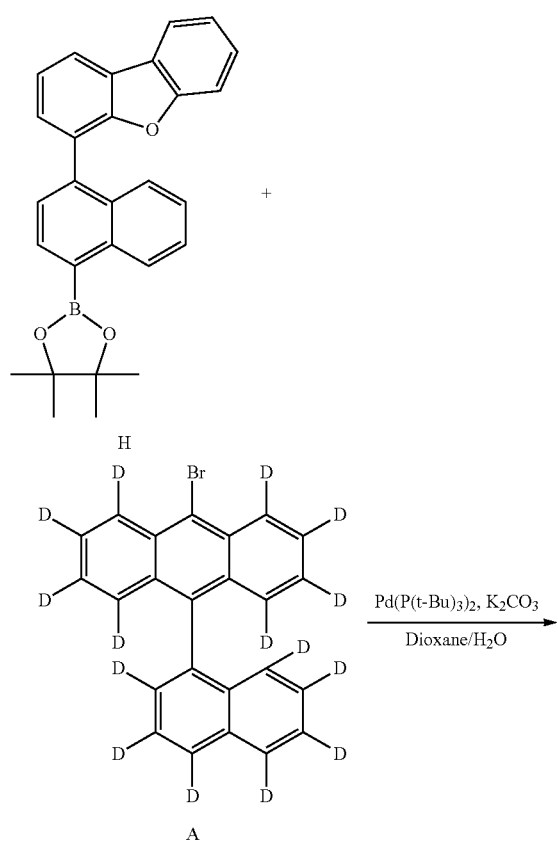

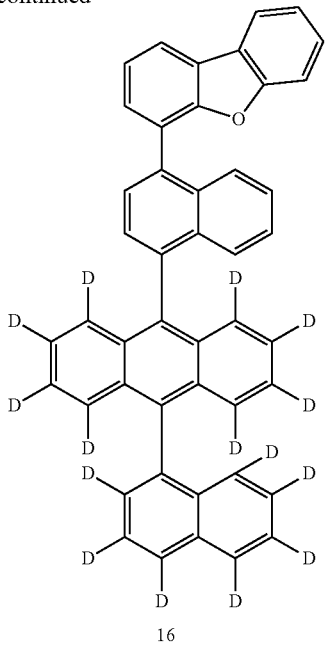

Compound 16 (16.6 g, yield 59%, MS[M+H]+=555) was obtained in the same manner as in Preparation Example 1-4.

[Experimental Example 1] Manufacture of Organic Light Emitting Device

Example 1

A glass substrate on which indium tin oxide (ITO) was coated as a thin film to a thickness of 150 nm was placed in detergent-dissolved distilled water and ultrasonically cleaned. Herein, a product of Fischer Co. was used as the detergent, and as the distilled water, distilled water filtered twice with a filter manufactured by Millipore Co. was used. After the ITO was cleaned for 30 minutes, ultrasonic cleaning was repeated twice using distilled water for 10 minutes. After the cleaning with distilled water was finished, the substrate was ultrasonically cleaned with solvents of isopropyl alcohol, acetone and methanol, then dried, and then transferred to a plasma cleaner. The substrate was cleaned for 5 minutes using nitrogen plasma, and then transferred to a vacuum deposition apparatus.

On the transparent ITO electrode prepared as above, the below compound HAT-CN was thermal vacuum deposited to a thickness of 50 Å to form a hole injection layer, and the below compound HTL1, a material transferring holes, was vacuum deposited thereon to a thickness of 1150 Å to form a hole transfer layer. Then, an electron blocking layer (150 Å) was formed using the below compound HTL2, and then a light emitting layer (360 Å, vacuum deposition) was formed using Compound 1 synthesized in Preparation Example 1 as a host and the below compound BD as a dopant (2% by weight with respect to total weight 100% of light emitting layer). After that, the below compound ETL1 was deposited to 50 Å to form a hole blocking layer, and an electron transfer layer having a thickness of 250 Å was formed by mixing the below compounds ETL2 and Liq in 7:3. After consecutively forming magnesium and lithium fluoride (LiF) having a thickness of 50 Å as an electron injection layer, magnesium and silver (1:4) were formed to 200 Å as a cathode, and the below compound CP1 was deposited to 600 Å to complete a device. In the process, the deposition rates of the organic materials were maintained at 1 Å/sec.
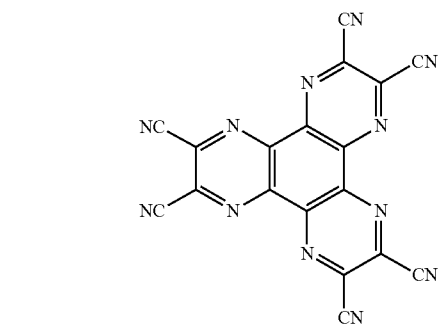
HAT-CN
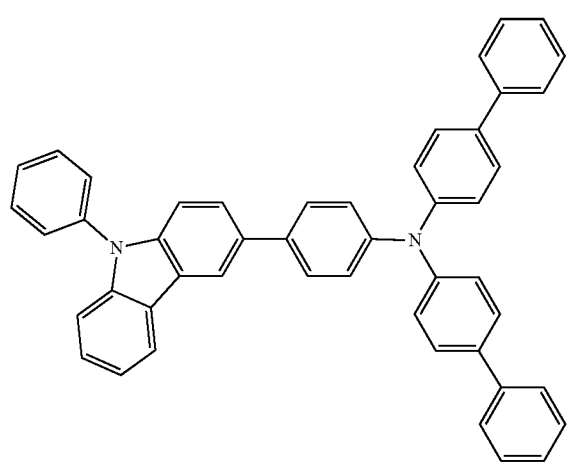
HTL1
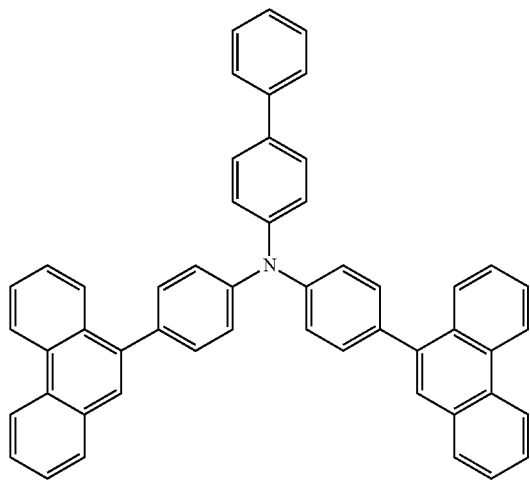
HTL2
-continued
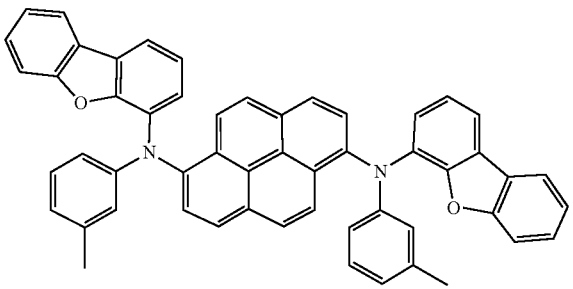
BD
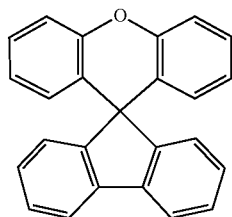
ETL-1
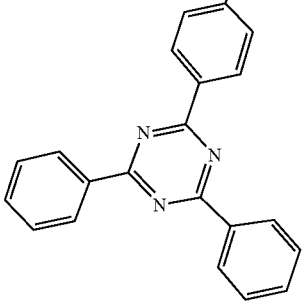
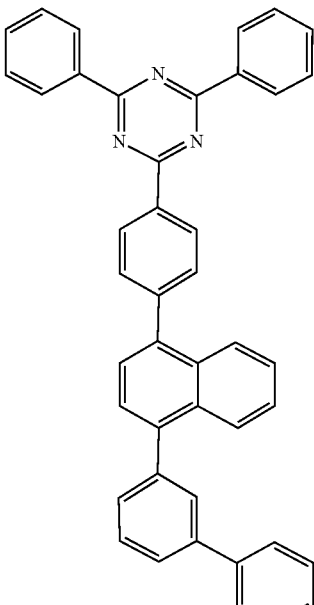
ETL2

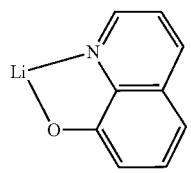
Liq
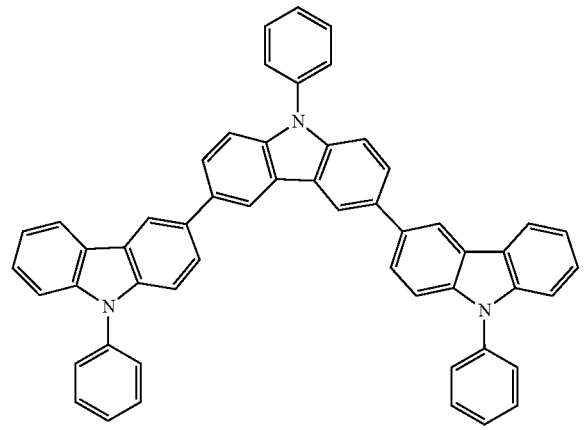
CP1
Examples 2 to 16
Organic light emitting devices were manufactured in the same manner as in Example 1 except that Compounds 2 to 16 were used instead of Compound 1 as the host compound of the light emitting layer.
1
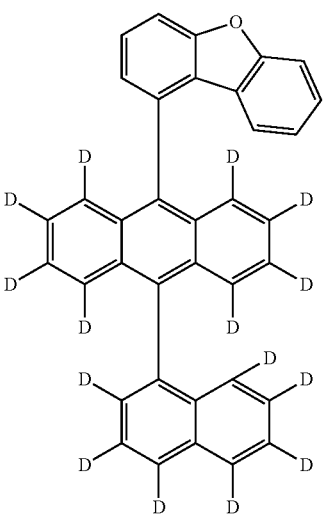
2
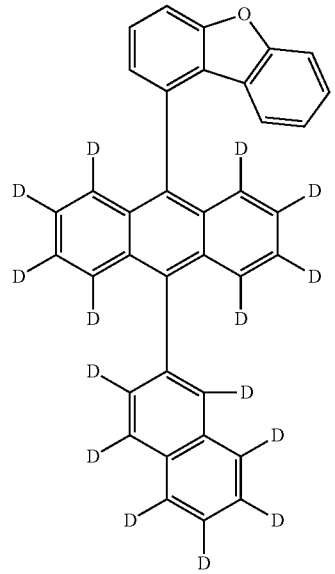
3
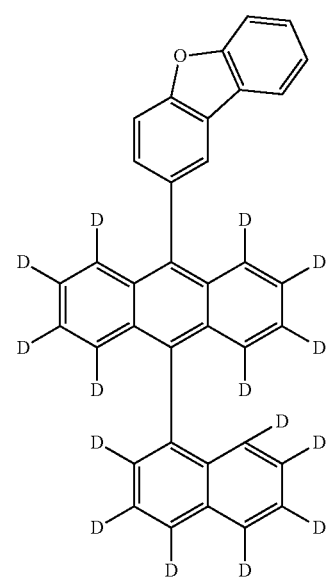

4
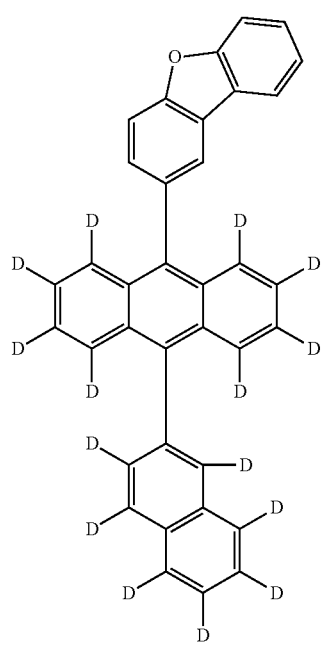
5
6
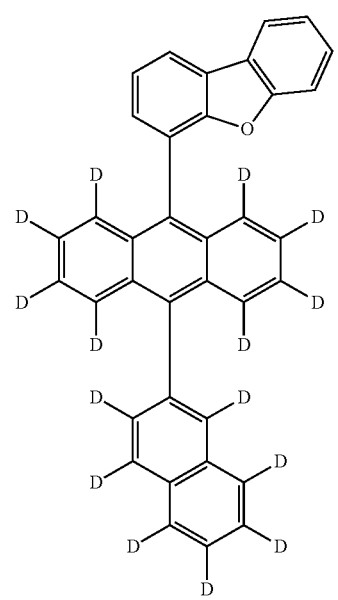
7
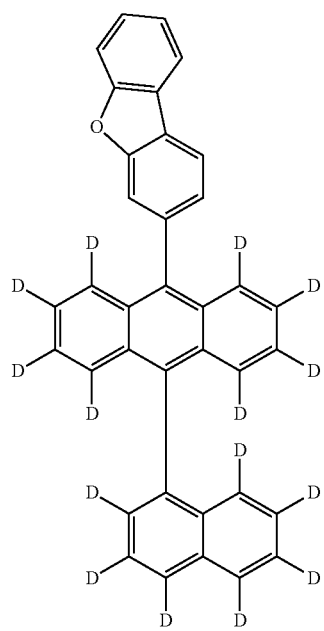
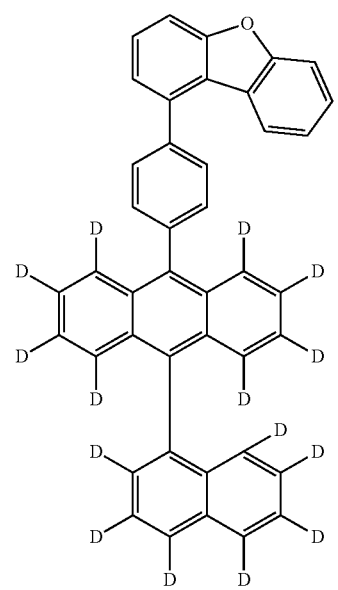

-continued
8
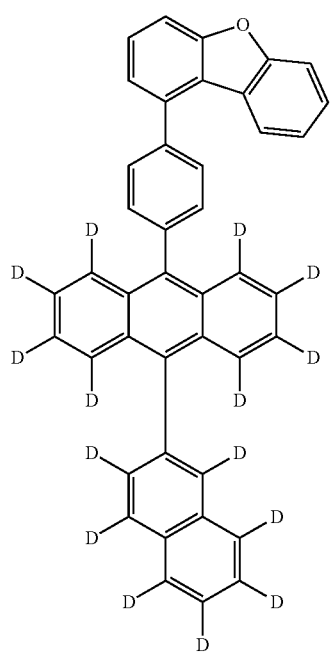
9
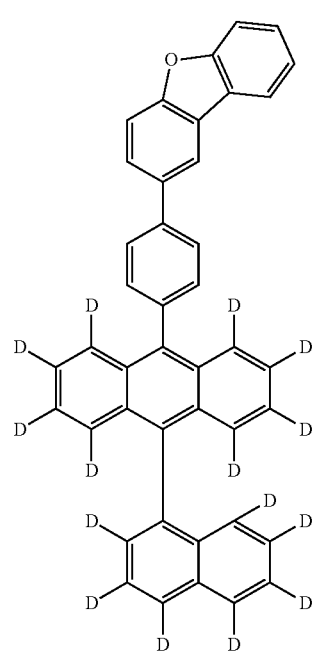
-continued
10
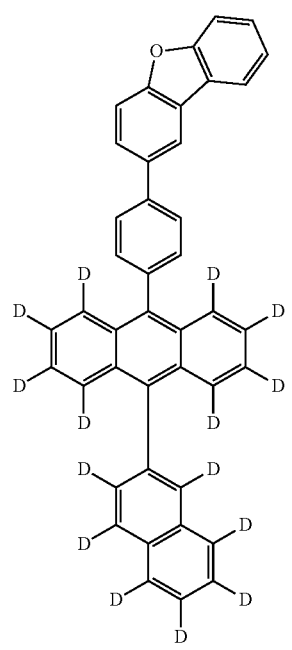
11
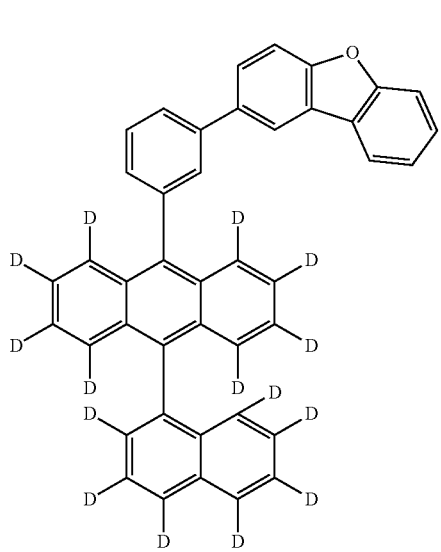

-continued
12
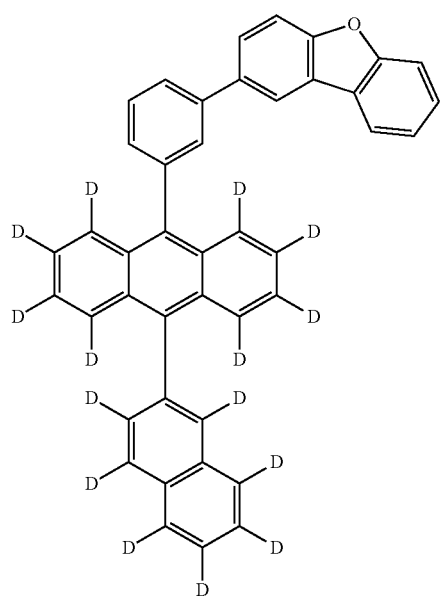
13
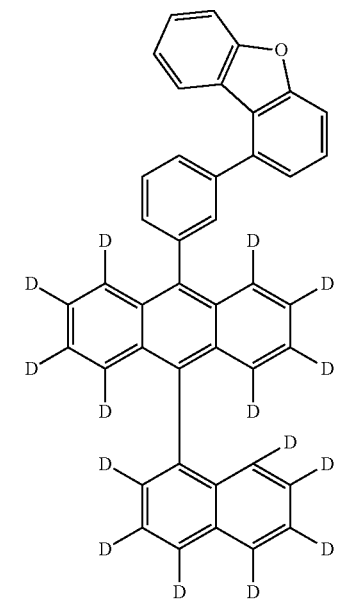
-continued
14
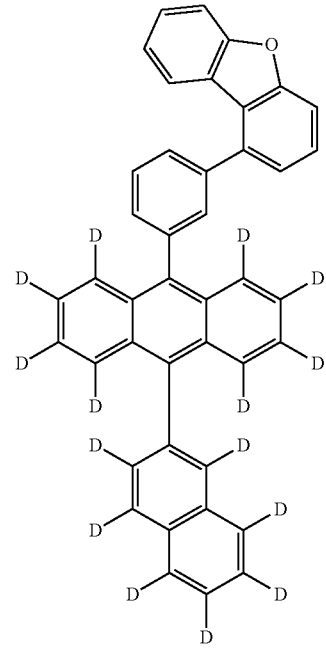
15
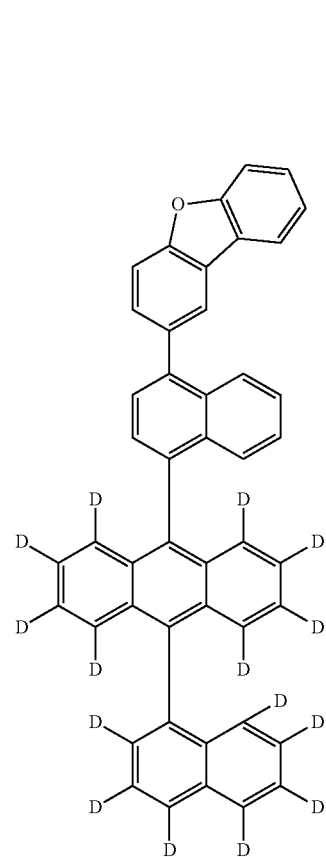

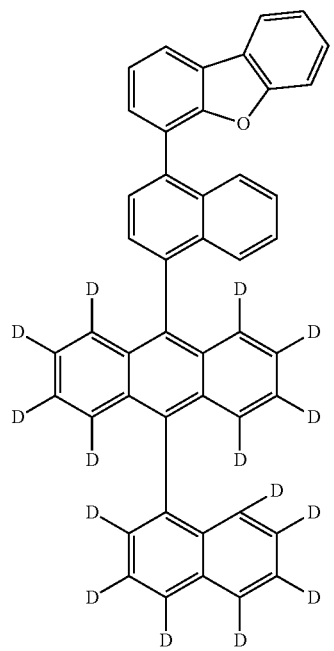
Comparative Examples 1 to 6
Organic light emitting devices were manufactured in the same manner as in Example 1 except that Compounds BH-A to BH-F were used instead of Compound 1 as the host compound of the light emitting layer. Each of Compounds BH-A to BH-F is as follows:
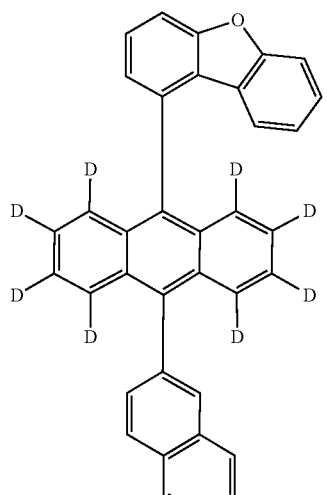
BH-A
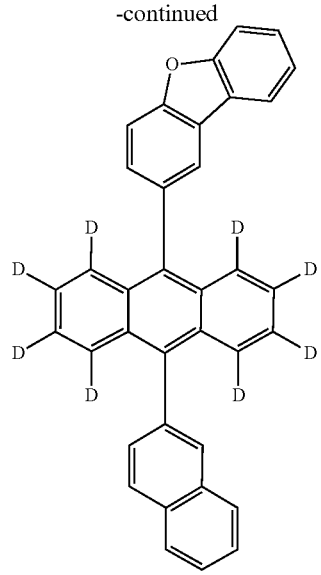
BH-B
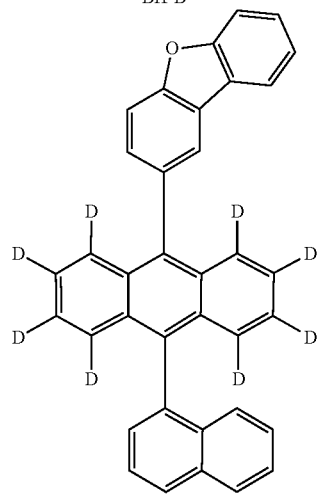
BH-C
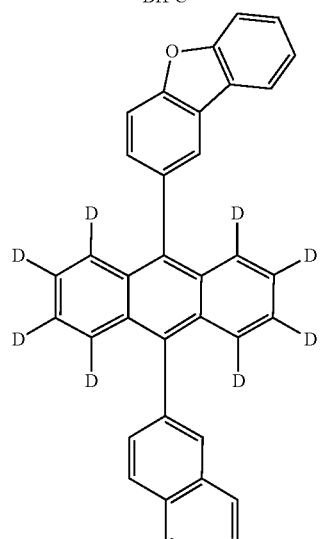
BH-A

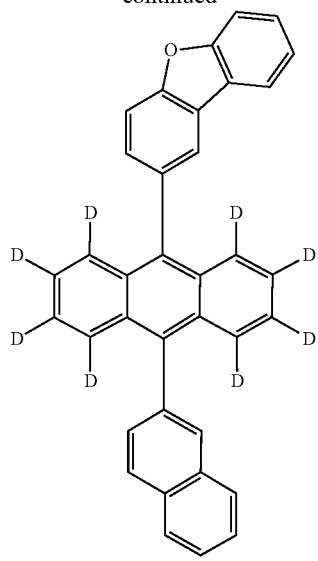

BH-B

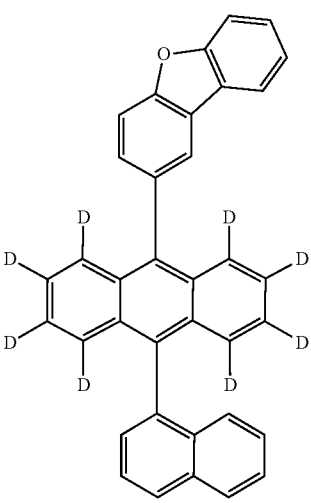

BH-C

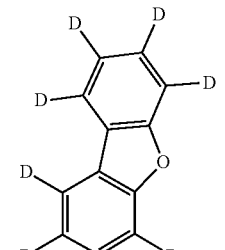

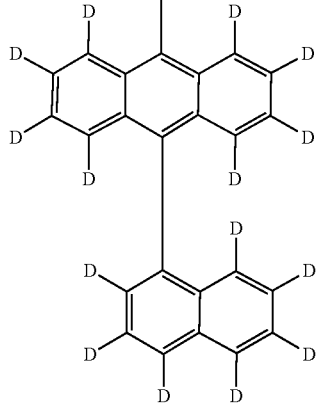

BH-G

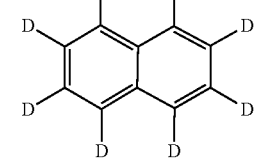

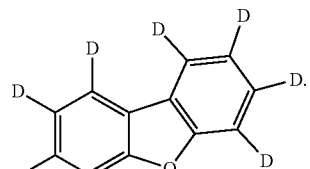

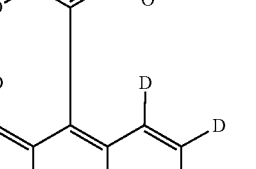

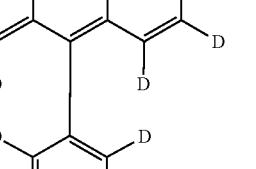

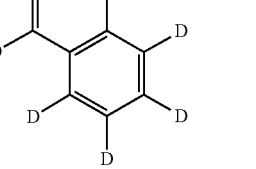

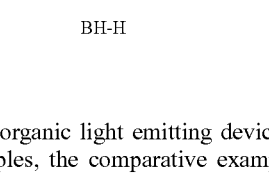

BH-H

Reference Examples 1 and 2

Organic light emitting devices were manufactured in the same manner as in Example 1 except that Compounds BH-G to BH-H were used instead of Compound 1 as the host compound of the light emitting layer. Each of Compounds BH-G to BH-H is as follows:

For each of the organic light emitting devices manufactured in the examples, the comparative examples and the reference examples, driving voltage and light emission efficiency were measured at current density of 10 mA/cm², and time ($T_{97}$) taken to become 97% with respect to initial luminance was measured at current density of 20 mA/cm². The results are shown in the following Table 1.

TABLE 1

| | | Measured Value at 10 mA/cm² | | | |
| | Host Compound | Driving Voltage ($V_{OP}$) | Light Emission Efficiency (Cd/A) | Color Coordinate CIE_x | Color Coordinate CIE_y | Life time ($T_{97}$) |
|---|---|---|---|---|---|---|
| Example 1 | 1 | 3.50 | 8.43 | 0.137 | 0.114 | 150 |
| Example 2 | 2 | 3.52 | 8.41 | 0.137 | 0.116 | 155 |
| Example 3 | 3 | 3.43 | 8.49 | 0.137 | 0.110 | 160 |
| Example 4 | 4 | 3.46 | 8.51 | 0.138 | 0.114 | 158 |
| Example 5 | 5 | 3.60 | 8.35 | 0.138 | 0.115 | 130 |
| Example 6 | 6 | 3.63 | 8.30 | 0.138 | 0.114 | 125 |
| Example 7 | 7 | 3.43 | 8.43 | 0.137 | 0.113 | 156 |
| Example 8 | 8 | 3.43 | 8.45 | 0.137 | 0.114 | 154 |
| Example 9 | 9 | 3.33 | 8.44 | 0.137 | 0.112 | 161 |
| Example 10 | 10 | 3.33 | 8.45 | 0.138 | 0.113 | 163 |
| Example 11 | 11 | 3.34 | 8.53 | 0.138 | 0.111 | 152 |
| Example 12 | 12 | 3.32 | 8.52 | 0.138 | 0.111 | 154 |
| Example 13 | 13 | 3.37 | 8.48 | 0.137 | 0.112 | 155 |
| Example 14 | 14 | 3.39 | 8.51 | 0.137 | 0.113 | 151 |
| Example 15 | 15 | 3.33 | 8.58 | 0.137 | 0.115 | 150 |
| Example 16 | 16 | 3.71 | 8.53 | 0.137 | 0.115 | 116 |
| Comparative Example 1 | BH-A | 3.50 | 8.39 | 0.137 | 0.116 | 100 |
| Comparative Example 2 | BH-B | 3.44 | 8.46 | 0.137 | 0.110 | 110 |
| Comparative Example 3 | BH-C | 3.45 | 8.53 | 0.138 | 0.114 | 110 |
| Comparative Example 4 | BH-D | 3.33 | 8.46 | 0.138 | 0.113 | 115 |
| Comparative Example 5 | BH-E | 3.32 | 8.51 | 0.138 | 0.111 | 105 |
| Comparative Example 6 | BH-F | 3.71 | 8.53 | 0.137 | 0.115 | 65 |
| Reference Example 1 | BH-G | 3.61 | 8.35 | 0.138 | 0.115 | 131 |
| Reference Example 2 | BH-H | 3.63 | 8.30 | 0.138 | 0.114 | 125 |

As shown in Table 1, it was seen that the organic light emitting devices of Examples 1 to 16 respectively including Chemical Formulae 1 to 16 as the host of the light emitting layer had significantly superior properties of long lifetime compared to the organic light emitting devices of Comparative Examples 1 to 6 respectively including Chemical Formulae BH-A to BH-F as the host, and it was seen that the organic light emitting devices of Examples 1 to 14 of the disclosure of the present application had equal effects with Reference Examples 1 and 2 including 100% deuterated compounds.

In addition, it was seen that the device had decreased driving voltage, increased efficiency or increased lifetime when linked to anthracene through the number 1 or 2 carbon of dibenzofuran as in Chemical Formulae 101 and 102 (Examples 1 to 4) compared to Chemical Formula 103 or 104 linked through the number 3 or 4 carbon of dibenzofuran (Examples 5 and 6).

<Experimental Example 2> Difference in Preparation Yield of Compound

Compound 5 of the present disclosure and Compound BH-G of the reference example are each synthesized through preparation methods as follows. In addition to Compound 5 of the present disclosure and Compound BH-G of the reference example, Compound 6 of the present disclosure and Compound BH-H of the reference example can also be synthesized using the following methods.

<Method for Preparing Compound 5>

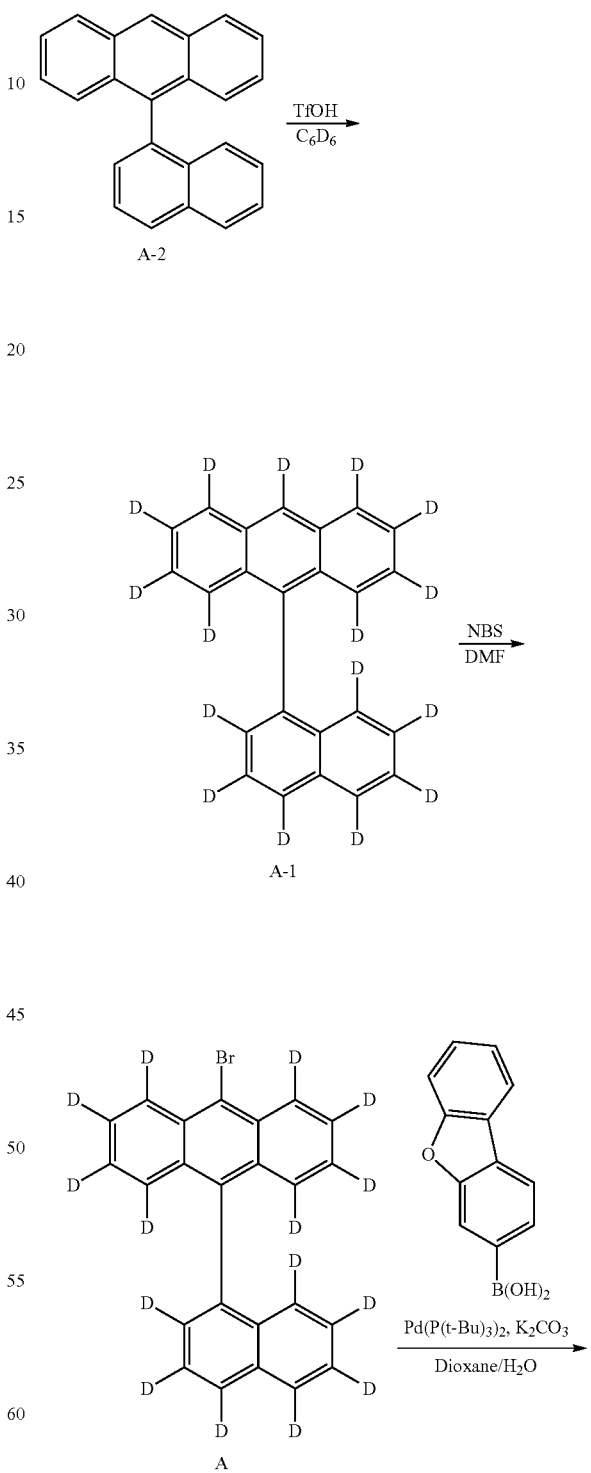

87
-continued

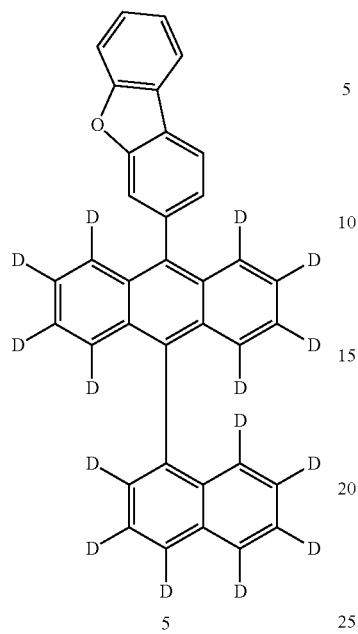

5

<Method for Preparing Compound BH-G>

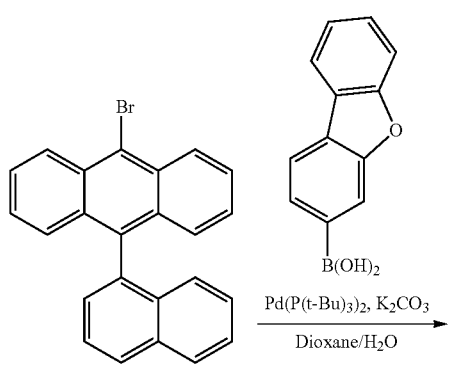

88
-continued

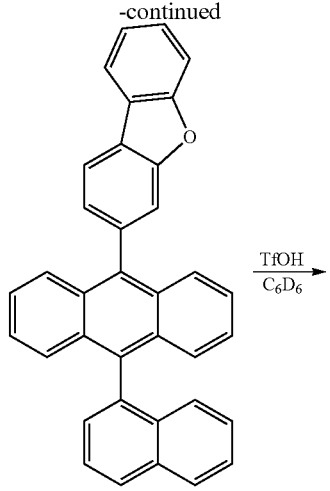

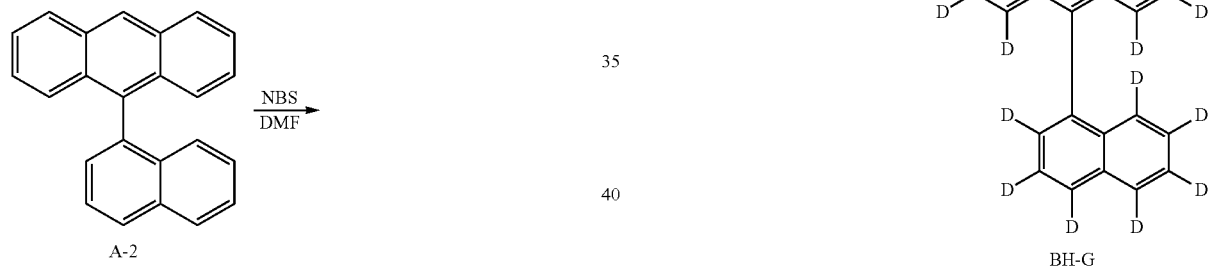

Compound 5 of the present disclosure can be prepared when linking unsubstituted dibenzofuran to the deuterated anthracene derivative. Herein, each of the steps has a yield of 96%, 90% and 52%, and an overall yield of 45% is obtained.

Meanwhile, completely deuterated Compound BH-G can be obtained through complete deuteration in the final step of the preparation. Herein, each of the steps has a yield of 91%, 88% and 46%, an overall yield of 32% is obtained.

Such a difference in the yield is due to a difference in the solubility of the material in the step of deuterium substitution, and it is due to the fact that the intermediate before linking the dibenzofuran (compound of the present disclosure) has more superior solubility compared to the dibenzofuran-linked intermediate (compound of the reference example).

In addition, the compound of the present disclosure has an advantage in terms of production costs since the amount of $C_6D_6$, the deuterium source, used in the preparation is reduced.

In other words, using the compound of the present disclosure leads to equal device performance while having high synthesis yield and low production costs compared to using the completely deuterated compound (compound of the reference example).

The invention claimed is:
1. An anthracene compound of Chemical Formula 1:

<Chemical Formula 1>

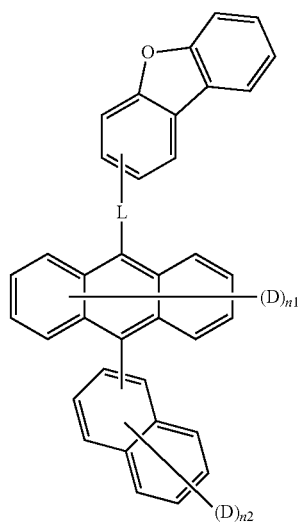

wherein, in Chemical Formula 1:
D is deuterium;
n1 is 8;
n2 is 7; and
L is a direct bond or any one selected from among the following structures:

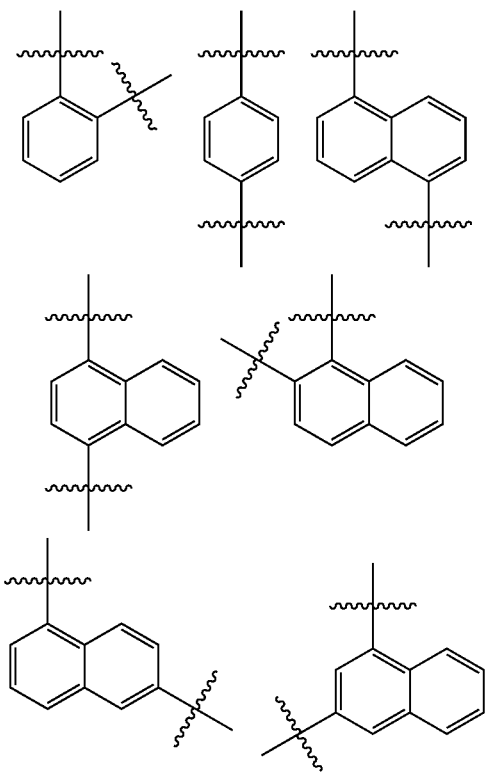

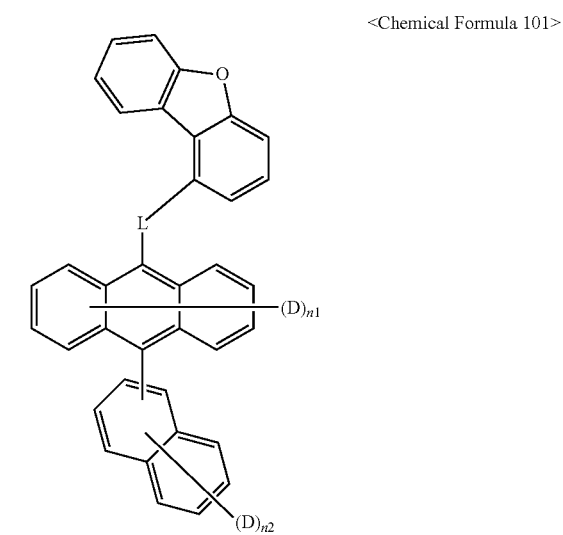

wherein the structures can be unsubstituted or substituted with a substituent selected from the group consisting of deuterium, an alkyl group, an aryl group, and a heteroaryl group, or a substituent in which two or more of these substituents are linked together.

2. The anthracene compound of claim 1, wherein Chemical Formula 1 is any one of the following Chemical Formulae 101 to 104:

<Chemical Formula 101>

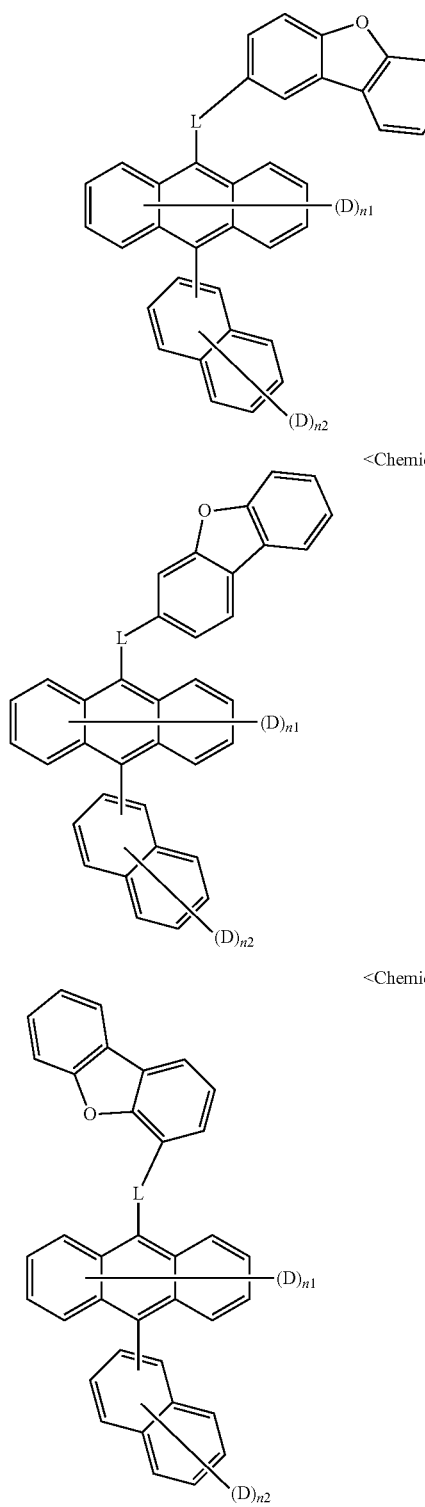

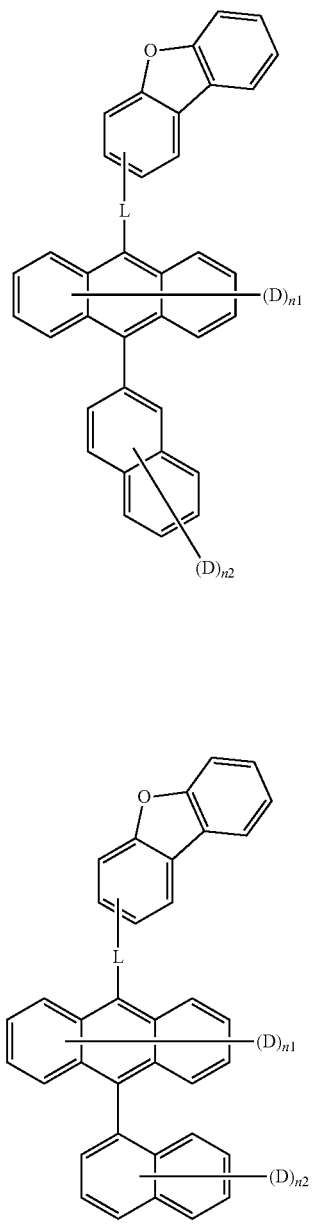

wherein in Chemical Formulae 101 to 104:

D, n1, n2 and L have the same definitions as in Chemical Formula 1.

3. The anthracene compound of claim 1, wherein Chemical Formula 1 is Chemical Formula 201 or 202:

wherein in Chemical Formula 201 or 202:

D, n1, n2 and L have the same definitions as in Chemical Formula 1.

4. The anthracene compound of claim 2, wherein Chemical Formula 1 is Chemical Formula 101 or 102.

5. The anthracene compound of claim 1, wherein the anthracene compound of Chemical Formula 1 is any one compound selected from among the following compounds:

93
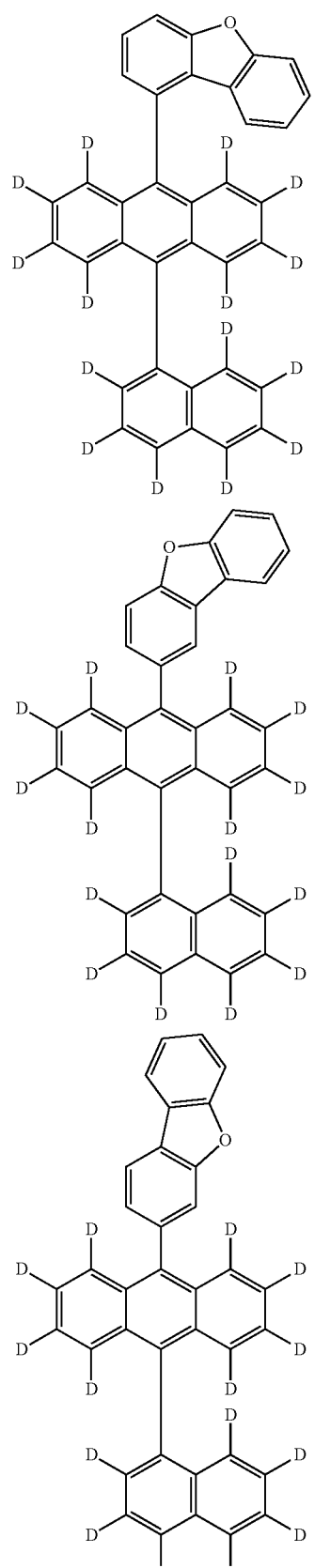
94
-continued
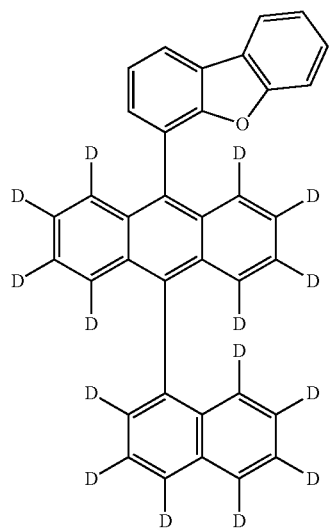
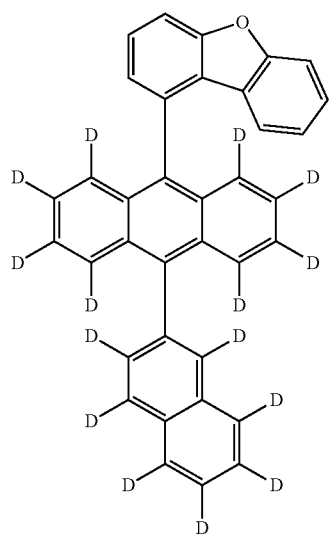
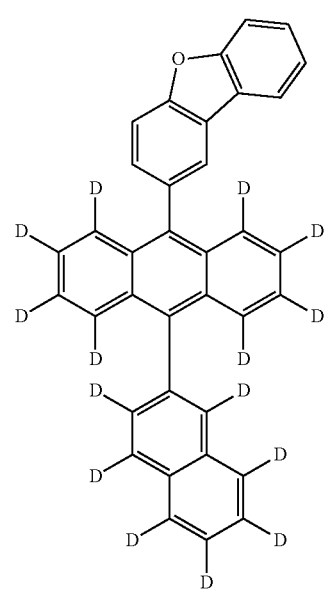

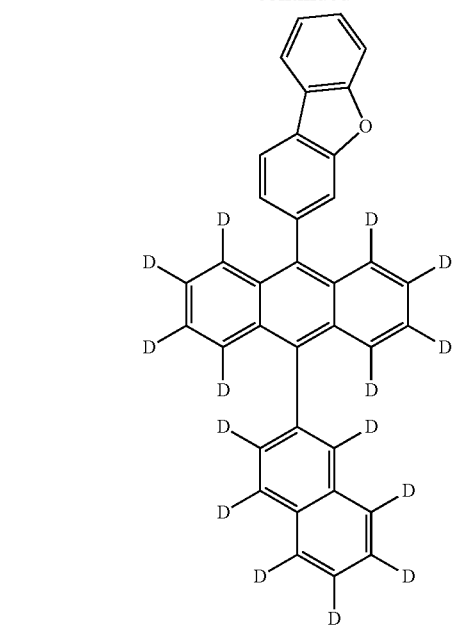
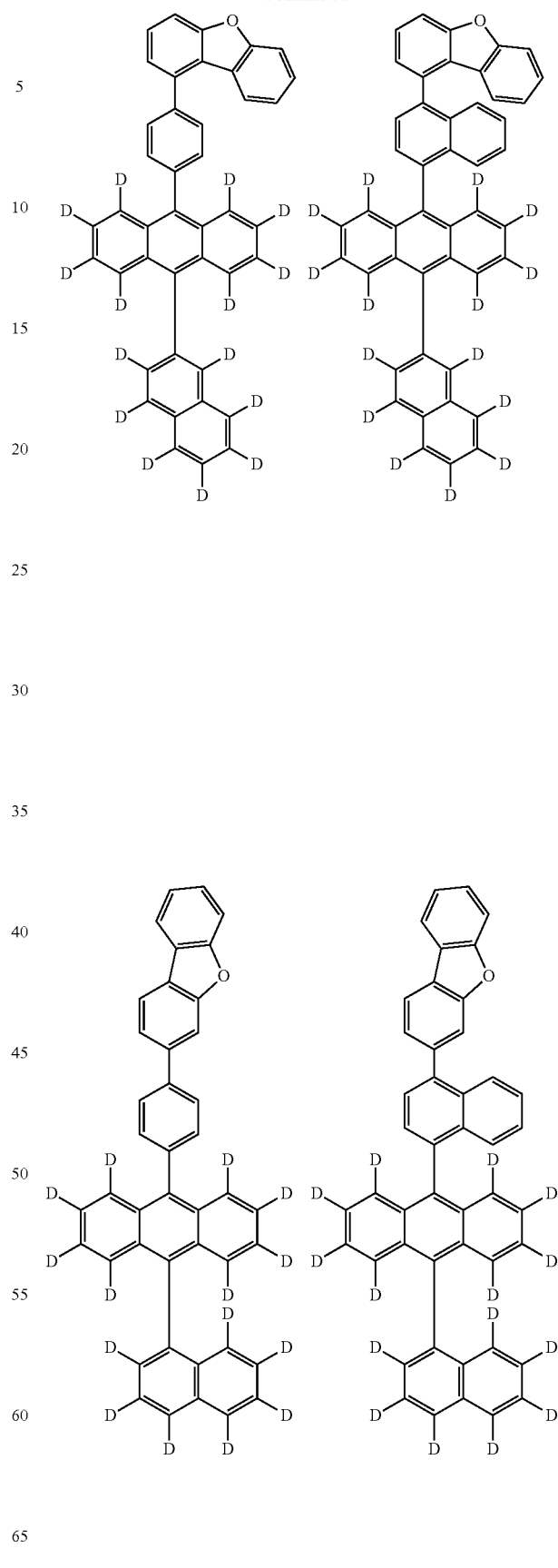

97
-continued
98
-continued
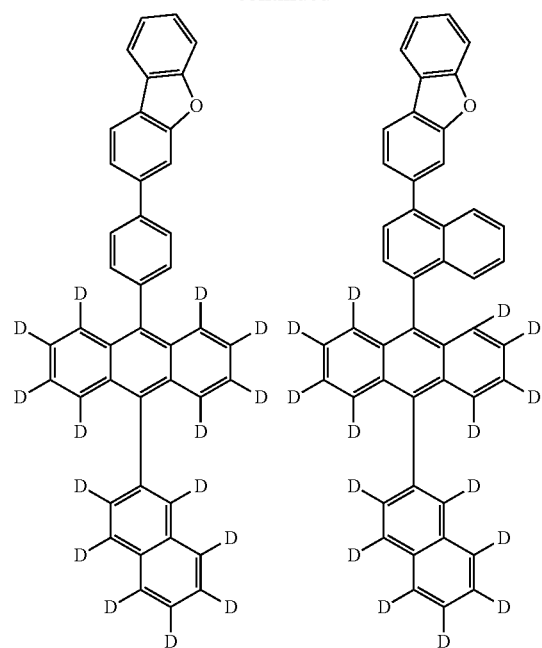
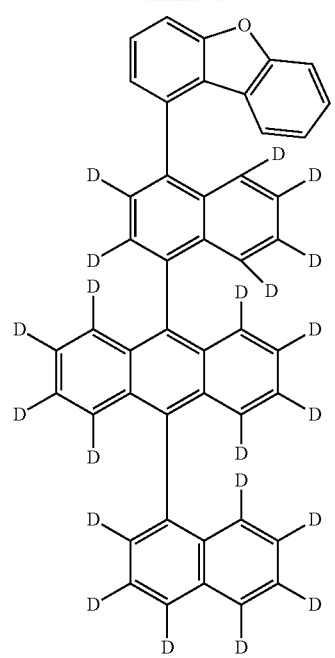
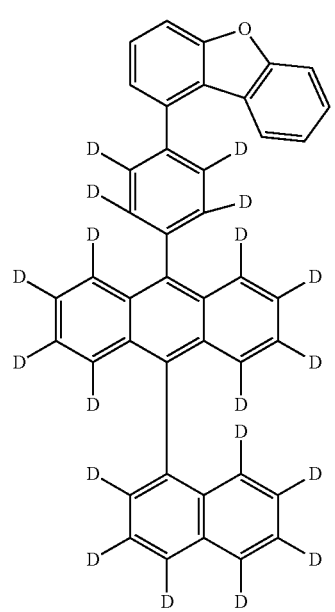 [SMILES: [2H]c1c([2H])c(-c2cccc3oc4ccccc4c23)c([2H])c([2H])c1-c1c2c([2H])c([2H])c([2H])c([2H])c2c(-c2c([2H])c([2H])c([2H])c3c([2H])c([2H])c([2H])c([2H])c23)c2c([2H])c([2H])c([2H])c([2H])c12]
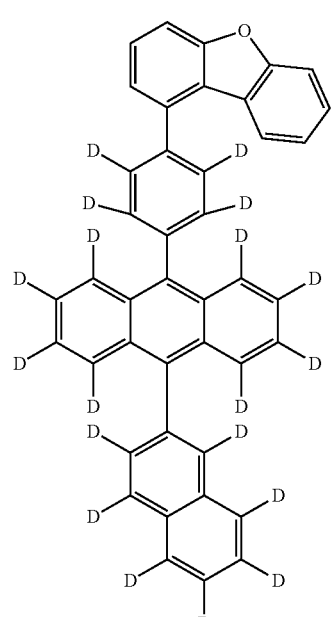

99
-continued
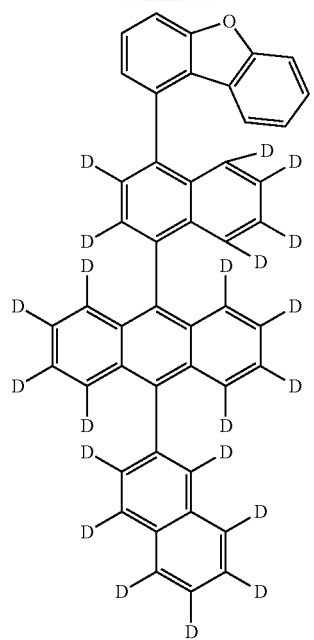
100
-continued
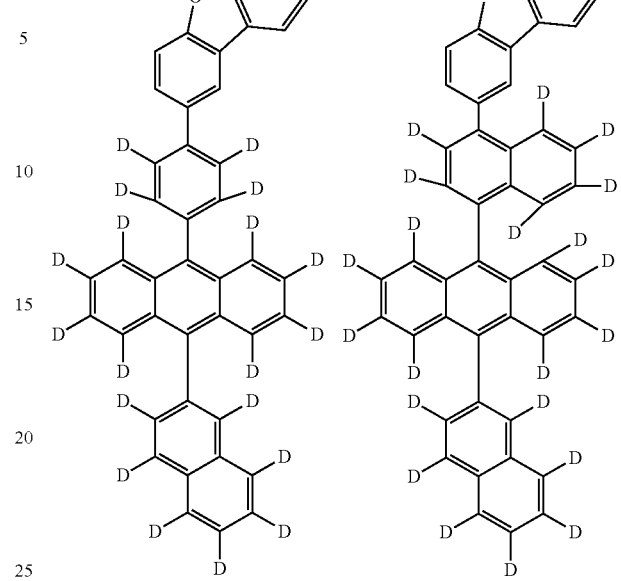
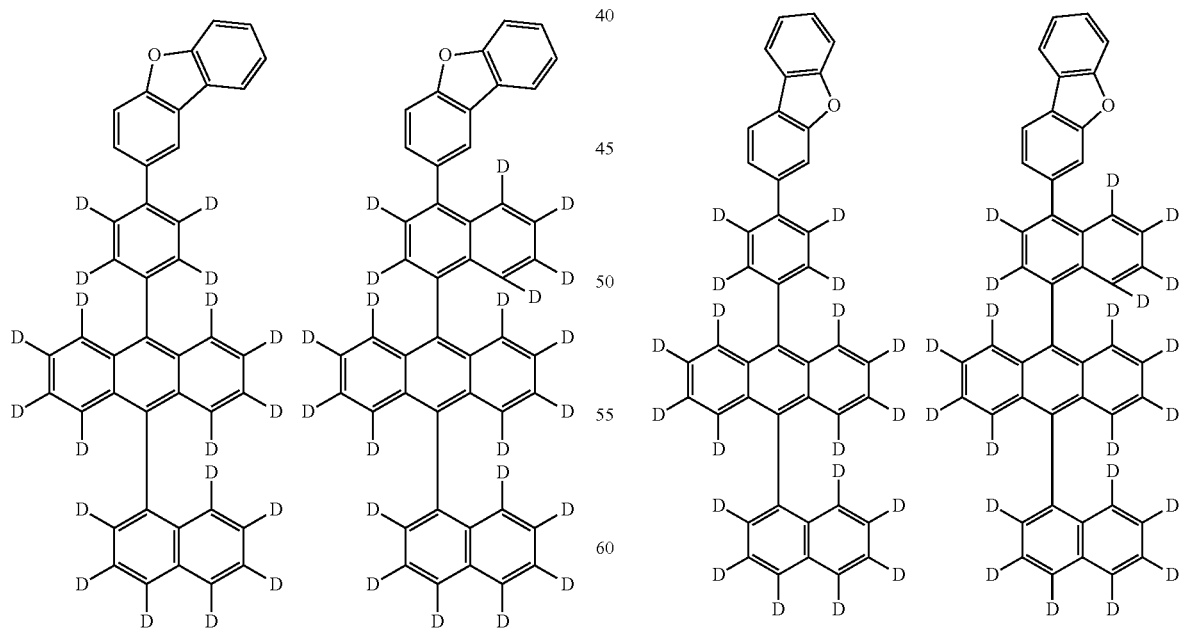

101
-continued
102
-continued
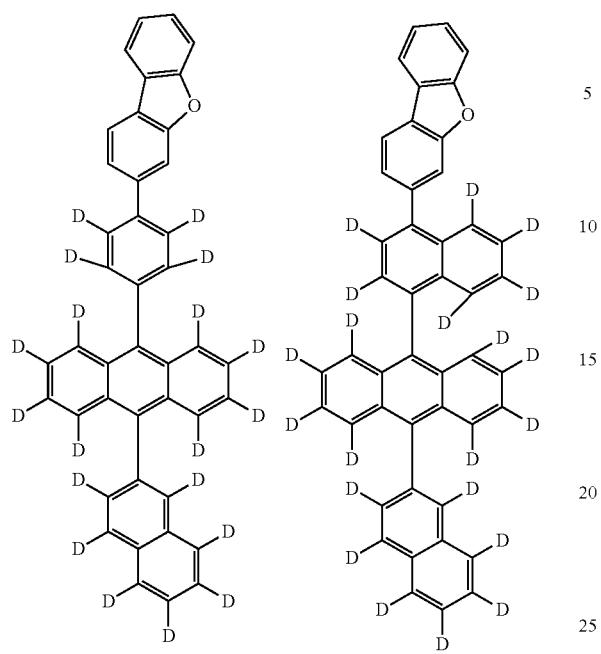
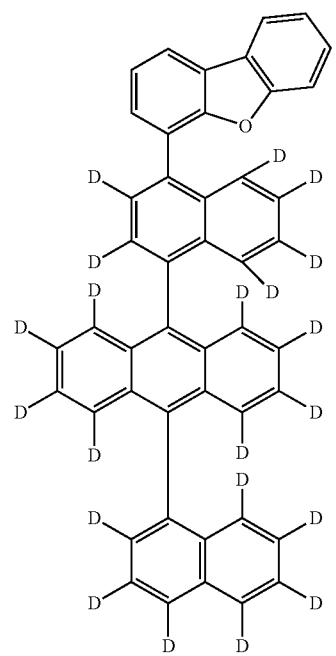
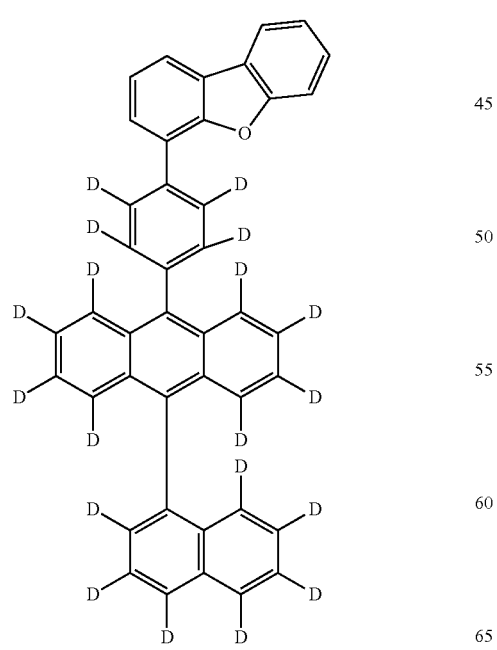
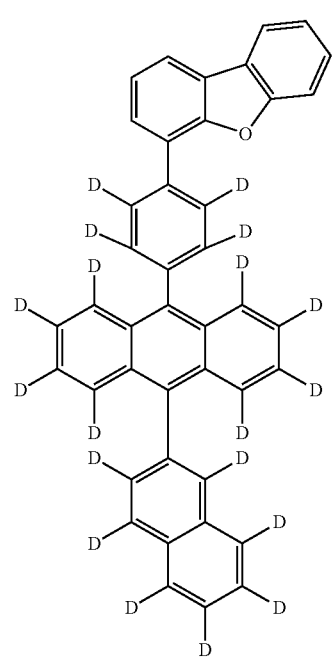

-continued

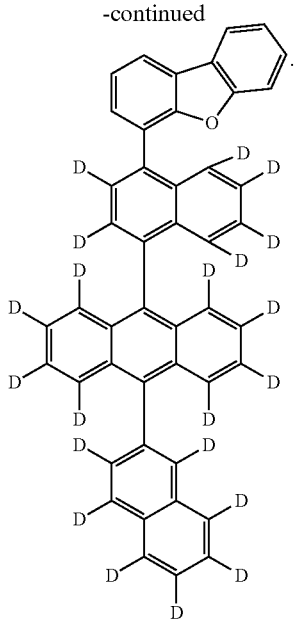

6. An organic light emitting device comprising:
a first electrode;
a second electrode provided opposite to the first electrode; and
one or more organic material layers provided between the first electrode and the second electrode,
wherein one or more layers of the organic material layers include the anthracene compound of claim 1.

7. The organic light emitting device of claim 6, wherein the organic material layer includes a light emitting layer, and the light emitting layer includes the anthracene compound as a host.

8. The organic light emitting device of claim 7, wherein the light emitting layer further includes an arylamine-based compound.

9. The organic light emitting device of claim 7, wherein the light emitting layer further includes a boron compound.

10. The organic light emitting device of claim 7, wherein the light emitting layer further includes an arylamine-based compound comprising deuterium.

* * * * *